(12) United States Patent
Baburske et al.

(10) Patent No.: US 12,323,134 B2
(45) Date of Patent: Jun. 3, 2025

(54) SEMICONDUCTOR SWITCHING MODULE WITH INSULATED GATE BIPOLAR TRANSISTOR AND UNIPOLAR SWITCHING DEVICE

(71) Applicant: Infineon Technologies AG, Neubiberg (DE)

(72) Inventors: Roman Baburske, Otterfing (DE); Frank Pfirsch, Munich (DE); Jana Hänsel, Dresden (DE); Katja Waschneck, Dresden (DE)

(73) Assignee: INFINEON TECHNOLOGIES AG, Neubiberg (DE)

( * ) Notice: Subject to any disclaimer, the term of this patent is extended or adjusted under 35 U.S.C. 154(b) by 52 days.

(21) Appl. No.: 18/115,080

(22) Filed: Feb. 28, 2023

(65) Prior Publication Data

US 2023/0275576 A1 Aug. 31, 2023

(51) Int. Cl.
*H03K 17/0812* (2006.01)
*H10D 12/00* (2025.01)
*H10D 62/10* (2025.01)
*H10D 62/832* (2025.01)

(52) U.S. Cl.
CPC ..... *H03K 17/08128* (2013.01); *H10D 12/481* (2025.01); *H10D 62/127* (2025.01); *H10D 62/8325* (2025.01)

(58) Field of Classification Search
CPC ........... H03K 17/08128; H03K 17/127; H03K 2017/6878; H03K 17/567; H01L 29/0696; H01L 29/1608; H01L 29/7397; H01L 25/0655; H01L 25/18; H01L 27/0727; H01L 29/1095; H01L 29/0834; H01L 29/407; H01L 29/8613; H01L 27/0705; H02M 1/08; H02M 1/088
See application file for complete search history.

(56) References Cited

U.S. PATENT DOCUMENTS

| | | | |
|---|---|---|---|
| 9,722,581 B2 * | 8/2017 | Zhao | H03K 17/122 |
| 10,461,739 B2 | 10/2019 | Basler et al. | |
| 2013/0062626 A1 * | 3/2013 | Takao | H01L 21/8258 257/77 |
| 2017/0366180 A1 * | 12/2017 | Baburske | H01L 29/1608 |
| 2022/0376605 A1 * | 11/2022 | Rahimo | H02M 1/088 |

OTHER PUBLICATIONS

European Search Report from Corresponding European Patent Application No. 22159145.6, 8 pages.

* cited by examiner

*Primary Examiner* — Metasebia T Retebo
(74) *Attorney, Agent, or Firm* — Cooper Legal Group LLC

(57) ABSTRACT

A semiconductor switching module includes an insulated gate bipolar transistor and a unipolar switching device. The insulated gate bipolar transistor includes a first transistor cell and a supplemental cell, wherein the first transistor cell includes a first gate and a first source and wherein the supplemental cell includes a second gate and a supplemental electrode. The unipolar switching device is based on a wide bandgap material and includes a third gate and a third source. The third gate and the second gate are electrically connected with each other and are disconnected from the first gate. The first source, the supplemental cell and the third source are electrically connected with each other.

20 Claims, 17 Drawing Sheets

SEMICONDUCTOR SWITCHING MODULE WITH INSULATED GATE BIPOLAR TRANSISTOR AND UNIPOLAR SWITCHING DEVICE

RELATED APPLICATION

This application claims priority to European Patent Application No. 22159145, filed on Feb. 28, 2022, entitled "SEMICONDUCTOR SWITCHING MODULE WITH INSULATED GATE BIPOLAR TRANSISTOR AND UNIPOLAR SWITCHING DEVICE", which is incorporated by reference herein in its entirety.

TECHNICAL FIELD

Examples of the present disclosure relate to a semiconductor switching module that includes an insulated gate bipolar transistor. In particular, the present disclosure relates to switching modules for power electronics.

BACKGROUND

Electrical circuits that convert electrical energy, such as DC-to-AC converters, AC-to-AC converters, and AD/DC converters, as well as electrical circuits that drive heavy inductive loads, such as motor driver circuits, typically include power semiconductor switches such as insulated gate bipolar transistors (IGBTs) and metal oxide semiconductor field effect transistors (MOSFETs).

N-channel IGBTs include an n-channel MOSFET with a lightly n doped drift region as a drain and a p conductive back side emitter on the back adjacent to the n conductive drift region. The lightly doped n conductive drift region enables comparatively high reverse voltages. In the on state, electrons flow from n conductive source regions through the n-channel of the MOSFET into the n conductive drift region. When the electrons reach the backside emitter, the backside emitter emits holes into the drift region. Despite the low doping of the drift region, the developing electron/hole plasma in n conductive drift region ensures a comparatively low resistance of the drift region, when the IGBT is on.

On turn-off, holes drain off from the drift region through heavily doped p conductive contact regions electrically connected in parallel to the n conductive source regions of the n-channel MOSFET. The hole current at each transition from the on state to the off state contributes to switching losses of the device. In IGBTs, the switching losses due to the turn-off hole current are higher than in unipolar switching devices.

There is a constant need to further improve the device characteristics of power electronics devices with little additional effort.

SUMMARY

To this purpose, the present disclosure relates to a semiconductor switching module including an insulated gate bipolar transistor and a unipolar switching device. The insulated gate bipolar transistor includes at least a first transistor cell and at least a supplemental cell, wherein the first transistor cell includes a first gate and a first source and wherein the supplemental cell includes a second gate and a supplemental electrode. The unipolar switching device is based on a wide bandgap material and includes a third gate and a third source. The third gate and the second gate are electrically connected with each other and are disconnected from the first gate. The first source, the supplemental electrode and the third source are electrically connected with each other.

The present disclosure further relates to a method of operating a semiconductor switching module including an insulated gate bipolar transistor and a unipolar switching device. The insulated gate bipolar transistor includes a first transistor cell and a second transistor cell, wherein the first transistor cell includes a first gate and a first source and wherein the second transistor cell includes a second gate and a second source. The unipolar switching device is based on a wide bandgap material and includes a third gate and a third source. The third gate and the second gate are electrically connected with each other and are disconnected from the first gate. The first, second and third sources are electrically connected with each other. The method includes turning on the unipolar switching device and the second transistor cell after turning on the first transistor cell, and turning off the unipolar switching device and the second transistor cell prior to turning off the first transistor cell.

Those skilled in the art will recognize additional features and advantages upon reading the following detailed description, and on viewing the accompanying drawings.

BRIEF DESCRIPTION OF THE DRAWINGS

The accompanying drawings are included to provide a further understanding of the embodiments and are incorporated in and constitute a part of this specification. The drawings illustrate embodiments of a semiconductor device and together with the description serve to explain principles of the embodiments. Further embodiments are described in the following detailed description and the claims. Features of the various illustrated embodiments may be combined with each other.

DETAILED DESCRIPTION

Figure 1A:
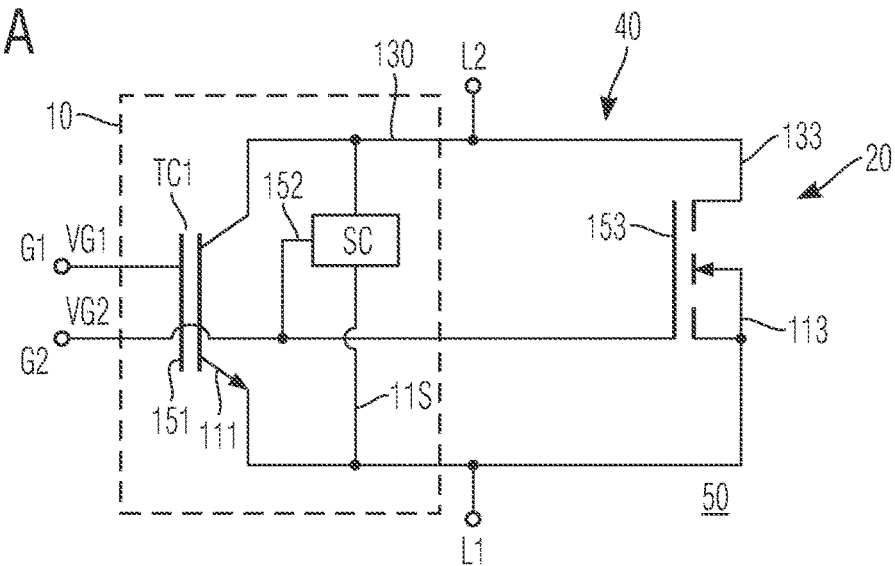
FIG. 1A illustrates a schematic circuit diagram of a semiconductor switching module with a parallel circuit including a unipolar switching device and an insulated gate bipolar transistor (IGBT) with first transistor cells and supplemental cells according to an embodiment.

In the following detailed description, reference is made to the accompanying drawings, which form a part hereof and in which are shown by way of illustrations specific embodiments in which a semiconductor device may be practiced. Other embodiments may be utilized and structural or logical changes may be made without departing from the scope of the present disclosure. For example, features illustrated or described for one embodiment can be used on or in conjunction with other embodiments to yield yet a further embodiment. It is intended that the present disclosure includes such modifications and variations. The examples are described using specific language, which should not be construed as limiting the scope of the appending claims. The drawings are not scaled and are for illustrative purposes only. Corresponding elements are designated by the same reference signs in the different drawings if not stated otherwise.

The terms "having", "containing", "including", "including" and the like are open, and the terms indicate the presence of stated structures, elements or features but do not preclude the presence of additional elements or features. The articles "a", "an" and "the" are intended to include the plural as well as the singular, unless the context clearly indicates otherwise.

The term "electrically connected" describes a permanent low-resistive ohmic connection between electrically connected elements, for example a direct contact between the concerned elements or a low-resistive connection via a metal and/or heavily doped semiconductor material.

The term "power semiconductor device" refers to semiconductor devices with a high voltage blocking capability of at least 30 V, for example 48 V, 100 V, 600 V, 1.6 kV, 3.3 kV or more and with a nominal on-state current or forward current of at least 200 mA, for example 1 A, 10 A or more.

MOSFETs (metal oxide semiconductor field effect transistor) are voltage controlled devices and may include one or more and/or all types of IGFETs (insulated gate field effect transistors) with gate electrodes based on doped semiconductor material and/or metal and with gate dielectrics made of oxide and/or dielectric materials other than oxides.

An ohmic contact describes a non-rectifying electrical junction between two conductors, in particular between a semiconductor material and a metal. The ohmic contact may have a linear or approximately linear current—voltage (I-V) curve in the first and third quadrant of the I-V diagram as with Ohm's law.

Ranges given for physical dimensions include the boundary values. For example, a range for a parameter y from a to b reads as a y b. The same holds for ranges with one boundary value like "at most" and "at least".

The term "on" is not to be construed as meaning only "directly on". Rather, if one element is positioned "on" another element (e.g., a layer is "on" another layer or "on" a substrate), a further component (e.g., a further layer) may be positioned between the two elements (e.g., a further layer may be positioned between a layer and a substrate if the layer is "on" said substrate).

Two adjoining doping regions in a semiconductor layer may form a semiconductor junction. Two adjoining doping regions of the same conductivity type and with different dopant concentrations form a unipolar junction (e.g., an n/n+ or p/p+ junction along a boundary surface between the two doping regions). At the unipolar junction a dopant concentration profile orthogonal to the unipolar junction may show a step or a turning point, at which the dopant concentration profile changes from being concave to convex, or vice versa. Two adjoining doping regions of complementary conductivity may form a pn junction.

The Figures illustrate relative doping concentrations by indicating "−" or "+" next to the doping type "n" or "p". For example, "n-" means a doping concentration which is lower than the doping concentration of an "n"-doping region while an "n+"-doping region has a higher doping concentration than an "n"-doping region. Doping regions of the same relative doping concentration may not necessarily have the same absolute doping concentration. For example, two different "n"-doping regions may have the same or different absolute doping concentrations.

An embodiment is related to a semiconductor switching module. The semiconductor switching module may include an insulated gate bipolar transistor and/or a unipolar switching device. The insulated gate bipolar transistor may include at least a first transistor cell and/or at least a supplemental cell. The first transistor cell may include a first gate and/or a first source. The supplemental cell may include a second gate and/or a supplemental electrode. The unipolar switching device may be based on a wide bandgap material and may include a third gate and/or a third source. The third gate and the second gate may be electrically connected with each other and may be disconnected from the first gate. The first source, the supplemental electrode and/or the third source may be electrically connected with each other.

The insulated gate bipolar transistor may be a reverse conducting IGBT (RC-IGBT) or a non-reverse conducting IGBT. The wide bandgap material may be and/or comprise gallium nitride (GaN), gallium arsenide (GaAs) and/or silicon carbide (SiC). The insulated gate bipolar transistor and the unipolar switching device may form a hybrid semiconductor switch.

The first gate and the third gate can be controlled independently of each other. An active first gate signal VG1 applied to the first gate may turn on the first transistor cell. An active second gate signal VG2 applied to the second gate and the third gate may turn on the unipolar switching device and may change an operation mode of the supplemental cell. The supplemental cell may include a second transistor cell, wherein the active second gate signal VG2 may also turn on the second transistor cell. Alternatively, the supplemental cell may include an auxiliary diode structure, wherein the active second gate signal VG2 may alter the diode characteristic of the auxiliary diode structure.

The first source, the supplemental electrode and/or the third source may be electrically connected to a first load terminal L1, which may form the emitter terminal of the hybrid semiconductor switch.

The IGBT may further include a common drain/collector structure. When the first transistor cell is on, the first transistor cell may conduct a load current portion between the first source and the drain/collector structure.

The IGBT may include a plurality of identical or almost identical first transistor cells electrically connected in parallel between the first load terminal L1 and the drain/collector structure and/or controllable by the first gate signal VG1.

The IGBT may include a plurality of identical or almost identical supplemental cells electrically connected in parallel between the first load terminal L1 and the drain/collector structure and/or controllable by the second gate signal VG2.

The unipolar switching device may include a drain. When the unipolar switching device is on, the unipolar switching device may conduct a unipolar load current portion between the third source and the drain.

The drain/collector structure of the IGBT may be electrically coupled to a second load terminal L2. The drain of the unipolar switching device may be electrically connected to the second load terminal L2. The second load terminal may form the collector terminal of the hybrid semiconductor switch.

By allowing the unipolar switching device to be controlled in synchronization with the supplemental cell and/or independently from the first transistor cell, the semiconductor switching module can be operated in various modes that may reduce electrical losses and/or improve device robustness at low additional effort.

According to an embodiment, the supplemental cell may include a second transistor cell, wherein the supplemental electrode may form a second source of the second transistor cell.

In other words, the semiconductor switching module may include an insulated gate bipolar transistor and/or a unipolar switching device. The insulated gate bipolar transistor may include at least a first transistor cell and/or at least a second transistor cell. The first transistor cell may include a first gate and/or a first source. The second transistor cell may include a second gate and/or a second source. The unipolar switching device may be based on and/or comprise a wide bandgap material and/or may include a third gate and/or a third source. The third gate and the second gate are electrically connected with each other and may be disconnected from the first gate. The first, second and/or third sources may be electrically connected with each other.

An active first gate signal VG1 applied to the first gate may turn on the first transistor cell. An active second gate signal VG2 applied to the second gate and/or the third gate may turn on the second transistor cell and/or the unipolar switching device.

The IGBT may be on when at least one of the first and/or second transistor cells is on. The IGBT may be off when both the first and the second transistor cells are off.

The first transistor cell, the second transistor cell and/or the unipolar switching device may have positive threshold voltages Vth1, Vth2, Vth3. The first transistor cell may turn on, when the first gate signal VG1 becomes active and/or a voltage level of the first gate signal VG1 exceeds the threshold voltage Vth1 of the first transistor cell. The second transistor cell may turn on, when a voltage level of the second gate signal VG2 exceeds the threshold voltage Vth2 of the second transistor cell. The unipolar switching device may turn on, when the voltage level of the second gate signal VG2 exceeds the threshold voltage Vth3 of the unipolar switching device. The second gate signal VG2 may be active, when a voltage level of the second gate signal VG2 exceeds both the second threshold voltage Vth2 and the third threshold voltage Vth3. The second gate signal VG2 may be inactive, when a voltage level of the second gate signal VG2 falls below both the second threshold voltage Vth2 and the third threshold voltage Vth3.

The first and second transistor cells may have the same threshold voltage. In some examples, the first transistor cell, the second transistor cell, and/or the unipolar switching device may have the same or at least approximately the same first threshold voltage Vthn (e.g., a difference between a threshold voltage of each of the first transistor cell, the second transistor cell, and/or the unipolar switching device may be less than a threshold amount).

The first, second and/or third sources may be electrically connected to a first load terminal L1, which may form the emitter terminal of the hybrid semiconductor switch.

The IGBT may further include a common drain/collector structure. When the first transistor cell is on, the first transistor cell may conduct a load current portion between the first source and the drain/collector structure. When the second transistor cell is on, the second transistor cell may conduct a load current portion between the second source and the drain/collector structure.

The IGBT may include a plurality of identical or almost identical first transistor cells electrically connected in parallel between the first load terminal L1 and the drain/collector structure and controllable by the first gate signal VG1.

The IGBT may include a plurality of identical or almost identical second transistor cells electrically connected in parallel between the first load terminal L1 and the drain/collector structure and controllable by the second gate signal VG2.

The unipolar switching device may include a drain. When the unipolar switching device is on, the unipolar switching device may conduct a unipolar load current portion between the third source and the drain.

The drain/collector structure of the IGBT may be electrically coupled to a second load terminal L2. The drain of the unipolar switching device may be electrically connected to a second load terminal L2. The second load terminal may form the collector terminal of the hybrid semiconductor switch.

By allowing the unipolar switching device to be controlled in synchronization with the second transistor cell and independently from the first transistor cell, the semiconductor switching module can be operated in various modes that may reduce electrical losses and/or improve device robustness at low additional effort.

According to an embodiment, the semiconductor switching module may further include a conduction loss reduction unit that turns on the unipolar switching device and the second transistor cell after turning on the first transistor cell, and that turns off the unipolar switching device and the second transistor cell prior to turning off the first transistor cell.

In particular, the conduction loss reduction unit controls the first gate signal VG1 such that it becomes inactive (only, for example) after a turn-off delay tdelay_off, after the second gate signal VG2 has become inactive. If the first transistor cell, the second transistor cell and the unipolar switching device are n channel devices, the conduction loss reduction unit controls the first and second gate signals VG1, VG2 such that the falling edge of the first gate signal VG1 lags the falling edge of the second gate signal VG2 by at least the turn-off delay tdelay_off.

The turn-off delay tdelay_off can be selected in dependence on a thickness of a semiconductor body of the IGBT. For example, for an RC-IGBT that includes a semiconductor body based on silicon and with a thickness th0, the turn-off delay tdelay_off in µs may be selected according to equation #1, wherein fmin may be equal to 10 and fmax may be equal to 40:

1: $fmin*th0[\mu m] < tdelay\_off[ns] < fmax*th0[\mu m]$

For example, the turn-off delay tdelay_off may be at least 1 µs (e.g., at least 2 µs or at least 5 µs).

Further, the conduction loss reduction unit controls the second gate signal VG2 such that it becomes active (only, for example) after a turn-on delay tdelay_on, after the first gate signal VG1 has become active. If the first transistor cell, the second transistor cell and the unipolar switching device are n channel devices, the conduction loss reduction unit controls the first and second gate signals VG1, VG2 such that the rising edge of the second gate signal VG2 lags the rising edge of the first gate signal VG1 by at least the turn-on delay tdelay_on. The turn-on delay tdelay_on may be at least 1 µs (e.g., at least 2 µs or at least 5 µs), by way of example.

For the time the second gate signal VG2 is active, the unipolar switching device may provide another low impedance path in parallel with the first and second transistor cells such that conduction losses can be reduced.

Since the unipolar switching device is (only, for example) switched on for a period of time that begins some time after the first transistor cell is switched on and ends some time before the first transistor cell is switched off, the unipolar switching device may switch exclusively under low forward bias such that (only, for example) low switching losses occur. Therefore, the unipolar switching device can be designed exclusively for low conduction losses and there may be no need to compromise with requirements for reduced switching losses in the unipolar switching device.

In addition, turning off the second transistor cell prior to the first transistor cell reduces the charge carrier plasma in the IGBT at the end of the on-state of the IGBT. Therefore, fewer charge carriers flow during turn-off of the IGBT and turn-off switching losses in the IGBT can be reduced.

The semiconductor switching module may include a gate driver circuit that integrates the conduction loss reduction unit. The conduction loss reduction unit may be permanently active or may be controllable. For example, the dual gate driver unit may be operated in several modes, wherein the conduction loss reduction unit may be active (only, for example) in a conduction loss reduction mode.

The conduction loss reduction mode may be active (only, for example) under forward bias (quadrant I operation mode), or both under forward and reverse bias (quadrant I and III operation modes).

According to an embodiment, the semiconductor switching module may further include a short-circuit protection unit configured to omit turning on the unipolar switching device and the second transistor cell in case a short-circuit condition may be detected after the first transistor cell has been switched on.

In particular, the gate driver circuit may operate in a short-circuit protection mode. The short-circuit protection mode can be triggered by a short-circuit detection signal SCD. In the short-circuit protection mode, the short-circuit protection unit may be active and may omit turning on the unipolar switching device and the second transistor cell, when a short-circuit condition has been detected after the first transistor cell has been switched on. In addition, the short-circuit protection unit may turn off the first transistor cell when the short-circuit condition may be detected after the first transistor cell may be turned on. The gate driver circuit may exit the short-circuit protection mode once the short-circuit condition is no longer present and/or the short-circuit detection signal SCD becomes inactive.

To this purpose, the semiconductor switching module (e.g., the gate driver circuit) may include a short-circuit sense circuit configured to monitor a suitable sense signal and to output the short-circuit detection signal SCD when the sense signal exceeds a threshold indicating a short-circuit condition.

According to an embodiment, the semiconductor switching module may further include an overcurrent protection unit that turns off the unipolar switching device and the second transistor cell, when an overcurrent condition is detected, and that turns on the unipolar switching device and the second transistor cell when the overcurrent condition ends.

In particular, the gate driver circuit may operate in an overcurrent protection mode. The overcurrent protection mode can be triggered by an overcurrent detection signal OCD. In the overcurrent protection mode, the overcurrent protection unit may be active and may turn off the unipolar switching device and the second transistor cell, in particular after the first transistor cell has been turned on. The gate driver circuit exits the overcurrent protection mode once the overcurrent condition is no longer present and/or the overcurrent detection signal OCD becomes inactive.

To this purpose, the semiconductor switching module (e.g., the gate driver circuit) may include an overcurrent sense circuit configured to monitor a suitable sense signal and to output the overcurrent detection signal SCD when the sense signal exceeds a threshold indicating an overcurrent condition.

According to an embodiment, the IGBT of the semiconductor switching module may include an auxiliary cell electrically connected in parallel to the first and second transistor cells. An operation mode of the auxiliary cell may be switchable between a first auxiliary cell mode and a second auxiliary cell mode by a second gate signal VG2 applied to the second gate. The IGBT may include a plurality of identical or almost identical auxiliary cells electrically connected in parallel between the first load terminal L1 and the drain/collector structure and controllable by the second gate signal VG2.

The auxiliary cell may have a diode structure, wherein the first auxiliary cell mode may be a standard diode mode with a comparatively high forward voltage, and wherein the second auxiliary cell mode may be an enhanced diode mode with a comparatively low forward voltage.

Alternatively, the auxiliary cell may have a field effect transistor structure, wherein the first auxiliary cell mode may be a transistor-off mode, and wherein the second auxiliary cell mode may be a transistor-on mode.

According to an embodiment, the IGBT of the semiconductor switching module may include a reverse diode structure electrically connected in parallel to the first and second transistor cells. An operation mode of the reverse diode structure may be switchable between an enhanced diode mode and a standard diode mode by the second gate signal VG2 applied to the second gate. A forward conductivity of the reverse diode structure in the enhanced diode mode may be higher than in the standard diode mode.

The reverse diode structure may be a first embodiment of the auxiliary cell described above.

The IGBT may include a plurality of identical or almost identical reverse diode structures electrically connected in parallel between the first load terminal L1 and the drain/collector structure and controllable by the second gate signal VG2. The IGBT further includes one or more ohmic connections between the drain/collector structure and the second load terminal, such as through first zones of the first conductivity type formed between the drain/collector structure and a second metallization on the backside of the IGBT. The reverse diode structures and the ohmic connections between the drain/collector structure and the second metallization through the first zones form a reverse conducting diode (RC diode) of an RC-IGBT. The RC diode may be in the forward conductive mode, when a positive voltage is applied between the first load terminal (emitter) and/or the second load terminal (collector) of the hybrid semiconductor switch.

In the enhanced diode mode, the IGBT carries a significant portion of the reverse current, which may be in the order of magnitude of the load current in the on-state of the IGBT. In particular, the RC diode may carry at least 40% (e.g., at least 70% or at least 90%) of the reverse current through the hybrid switching module in the enhanced diode mode. Thus, a temperature ripple experienced by the IGBT can be comparatively small, in particular in combination with an IGBT design ensuring strong thermal coupling between the transistor cells and the reverse diode structure. The low temperature ripple may extend the operational lifetime of the IGBT.

On the other hand, the RC diode may carry at most 40% (e.g., at most 20% or at most 3%) of the reverse current through the hybrid switching module in the standard diode mode. In the standard diode mode, a body diode of the unipolar switching device or an additional semiconductor diode may take over a greater part of the reverse current and the semiconductor switching module can operate with high efficiency.

According to an embodiment, the reverse diode structure of the semiconductor switching module may include a trench electrode structure including a trench electrode electrically connected with the second gate, and a doped diode zone in contact with a sidewall of the trench electrode structure.

Since the trench electrode of the reverse diode structure may be electrically connected with the second gate, the second gate signal VG2 can be applied to the trench electrode and the voltage level of the second gate signal VG2 may control the forward conductivity in the doped diode zones, such as by forming inversion channels along the sidewall of the trench electrode structure.

According to an example related to n channel first and second transistor cells the doped diode zones are p conductive, and a sufficiently negative potential applied to the diode trench electrodes may accumulate holes in accumulation layers along the diode trench electrodes through the doped diode zones exclusively in the enhanced diode mode. In particular, the accumulation layers may form at a voltage below a negative second threshold voltage Vthp, wherein the reverse diode structure may be in the enhanced diode mode when the second gate voltage VG2 is lower than the second threshold voltage Vthp (VG2<Vthp) and/or in the standard diode mode when the second gate voltage VG2 is higher than the second threshold voltage Vthp (VG2>Vthp).

According to an embodiment, the IGBT of the semiconductor switching module may include a reverse diode structure electrically connected in parallel to the first and second transistor cells. An operation mode of the reverse diode structure may be switchable between an enhanced diode mode and a standard diode mode by the first gate signal VG1 applied to the first gate. A forward conductivity of the reverse diode structure in the enhanced diode mode may be higher than in the standard diode mode.

In this embodiment, the operation mode of the reverse diode structure may be controlled based on the first gate voltage applied to the first gate.

According to an embodiment, the reverse diode structure of the semiconductor switching module may include a trench electrode structure including a trench electrode electrically connected with the first gate, and a doped diode zone in contact with a sidewall of the trench electrode structure.

According to an embodiment, the semiconductor switching device may include a plurality of evenly distributed reverse diode structures. In particular, trench electrodes of a plurality of reverse diode structures may be evenly distributed in a horizontal plane of a semiconductor body.

For example, each of a plurality of first transistor cells, each of a plurality of second transistor cells and each of a plurality of reverse diode structures includes a trench electrode formed in a trench electrode structure extending from a first surface of a semiconductor body into the semiconductor body, and the trench electrodes of the reverse diode structures are evenly distributed in the horizontal plane of the semiconductor body.

Then it may be possible that not more than three or not more than two trench electrodes of the reverse diode structure are formed directly neighboring each other with no first and/or second transistor cells in between. The reverse diode structures can be highly uniformly distributed across a horizontal plane of the semiconductor body, wherein the number of first and second transistor cells between neighboring reverse diode structures may be approximately the same across at least a great portion of the semiconductor body (e.g., a difference between a first number of first and second transistor cells between neighboring reverse diode structures in a first portion of the semiconductor body, a first number of first and second transistor cells between neighboring reverse diode structures in a second portion of the semiconductor body, and/or a first number of first and second transistor cells between neighboring reverse diode structures in a third portion of the semiconductor body may be less than a threshold amount). The reverse diode structures, the first transistor cells, and the second transistor cells are strongly interleaved with each other such that the reverse diode structures and the transistor cells are strongly thermally coupled.

According to an embodiment, the IGBT of the semiconductor switching module may include at least one diode region and/or at least one transistor region, wherein the reverse diode structure may be formed in the at least one diode region and/or wherein the first and second transistor cells may be formed in the at least one transistor region. For example, the IGBT may include one single diode region and/or one single transistor region.

The first and second transistor cells are absent in the at least one diode region and the at least one transistor region does not contain reverse diode structures. The reverse diode structure and the transistor cells are (only, for example) weakly thermally coupled.

A ratio of a total horizontal area of the at least one diode region and a total horizontal area of the at least one transistor region may be in a range from 1:2 to 1:5 (e.g., 1:3 to 1:4).

According to an embodiment, the semiconductor switching module may further include a reverse current control unit that switches the reverse diode structure into the enhanced diode mode in response to a level change of a diode control signal DCS. The reverse current control unit may be integrated in the gate driver circuit.

The reverse current control unit facilitates to select one of the operation modes of the reverse diode structure as standard operation mode for a certain application and/or to change the operation mode of the reverse diode structure in response to an operator command or a change of internal conditions. Operation in the enhanced diode mode may extend operational lifetime of the IGBT and operation in the standard diode mode may improve power efficiency of the semiconductor switching module.

According to an embodiment, the semiconductor switching module may further include a diode mode control unit configured to activate the diode control signal DCS in response to a second mode control signal MC2. The diode mode control unit may be integrated in the gate driver circuit.

In particular, a change of an internal condition like reaching a predefined operating point, expiring a predefined operating time, reaching a predefined temperature or temperature budget may activate the second mode control signal MC2 and the active second mode control signal MC2 may trigger activation of the diode control signal DCS.

According to an embodiment, the semiconductor switching module may further include a surge current control unit that activates the diode control signal DCS in response to detection of a surge current event. The surge current control unit may be integrated in the gate driver circuit.

In particular, the gate driver circuit can be operated in a surge current control mode. The surge current control mode can be triggered by a surge current detection signal SCD. The surge current control mode may be (only, for example) active under reverse bias (Quadrant III operation mode).

Before a surge current is detected, the reverse diode structure can be in the standard diode mode with lower forward conductivity and higher forward voltage drop than the body diode of the unipolar switching device such that the unipolar switching device may carry a great portion of the reverse current. In response to detection of a surge current event, the surge current control unit may becomes active and ensure that the reverse diode structure changes into the enhanced diode mode and/or remains in the enhanced diode mode. In the enhanced diode mode, the voltage drop across the reverse diode structure can be lower than across the body diode of the unipolar switching device such that the reverse diode structure may take a greater part of the surge current and/or the unipolar switching device can be efficiently protected against thermal degradation caused by surge current events.

The gate driver circuit can exit the surge current control mode as soon as the surge current condition is removed and no longer present.

According to an embodiment, the semiconductor switching module may further include a light load mode unit, wherein, when a light load condition exists, the light load mode unit may turn on the unipolar switching device and/or the second transistor cell before the first transistor cell is turned on.

In particular, the light load mode unit may be configured to temporarily operate the IGBT and the unipolar switching device in a first light load mode, wherein in the first light load mode, the light load mode unit may be active and may turn on (only, for example) the unipolar switching device and/or the second transistor cell, whereas the first transistor cell may remain turned off.

According to another embodiment, the light load mode unit turns on the unipolar switching device and the second transistor cell before turning on the first transistor cell and turns off the unipolar switching device and the second transistor cell after turning off the first transistor cell in case of the light load condition.

In particular, the light load mode unit may be configured to temporarily operate the IGBT and the unipolar switching device in a second light load mode. In the second light load mode, the light load mode unit may be active and may turn on the unipolar switching device and/or the second transistor cell prior to turning on the first transistor cell, and/or may turn off the unipolar switching device and/or the second transistor cell after turning off the first transistor cell.

Any light load mode may be activated by a light load signal LLS indicating a light load condition. Any light load mode may be (only, for example) active under forward bias (quadrant I operation mode), or both under forward and reverse bias (quadrant I and III operation modes).

Under light load conditions, a unipolar switching device such as a SiC-MOSFET usually shows lower conduction and switching losses than an IGBT. Therefore, increasing the load current component of the unipolar switching device can reduce the total conduction losses in the semiconductor switching module.

Another embodiment is related to a method of operating a semiconductor switching module that includes an IGBT and a unipolar switching device. The IGBT includes a first transistor cell and a second transistor cell, wherein the first transistor cell includes a first gate and a first source, and wherein the second transistor cell includes a second gate and a second source. The unipolar switching device may be based on a wide bandgap material and includes a third gate and a third source. The third gate and the second gate are electrically connected and disconnected from the first gate. The first, second and third sources are electrically connected with each other. The method may include turning on the unipolar switching device and the second transistor cell after turning on the first transistor cell, and turning off the unipolar switching device and the second transistor cell prior to turning off the first transistor cell.

According to an embodiment, the IGBT may further include a reverse diode structure electrically connected in parallel to the first and second transistor cells, wherein an operation mode of the reverse diode structure may be switchable between an enhanced diode mode and a standard diode mode by a second gate signal VG2 applied to the second gate, and wherein a forward conductivity of the reverse diode structure in the enhanced diode mode may be higher than in the standard diode mode. The method of operating the semiconductor switching module may include switching the reverse diode structure into the enhanced diode mode in response to a voltage level change of a diode control signal.

According to an embodiment, the method may further include turning off the unipolar switching device and the second transistor cell when an overcurrent or short circuit condition is detected, and turning on the unipolar switching device and the second transistor cell, when the overcurrent condition is no longer present.

FIG. 1A shows a semiconductor switching module 50 that includes an insulated gate bipolar transistor 10 and a unipolar switching device 20. The insulated gate bipolar transistor 10 includes first transistor cells TC1 and supplemental cells SC. Each first transistor cell TC1 includes a first gate 151 and a first source 111. Each supplemental cell SC includes a second gate 152 and a supplemental electrode 11S. The insulated gate bipolar transistor 10 further includes a common drain/collector structure 130 for the first transistor cells TC1 and the supplemental cells SC. When the first transistor cells TC1 are turned on, current flows between the first source 111 and the common drain/collector structure 130.

The unipolar switching device 20 may be a SiC-MOSFET and includes a third gate 153, a third source 113 and a drain 133. When the unipolar switching device 20 is turned on, current flows between the third source 113 and the drain 133 of the unipolar switching device 20.

A first gate terminal G1 of the semiconductor switching module 50 is electrically connected to the first gates 151 of the first transistor cells TC1. A second gate terminal G2 of the semiconductor switching module 50 is electrically connected to the second gates 152 of the supplemental cells SC and to the third gate 153 of the unipolar switching device 20.

A first load terminal L1 of the semiconductor switching module 50 is electrically connected to the first sources 111, the supplemental electrodes 11S and the third source 113. A second load terminal L2 is electrically connected to the common drain/collector structure 130 of the insulated gate bipolar transistor 10 and the drain 133 of the unipolar switching device 20.

The first gate 151 on the one hand and the third gate 153 and the second gate 152 on the other hand can be separately controlled such that the semiconductor switching module 50 can be operated in various modes that reduce electrical losses and/or improve device robustness at low additional effort.

Figure 1B:
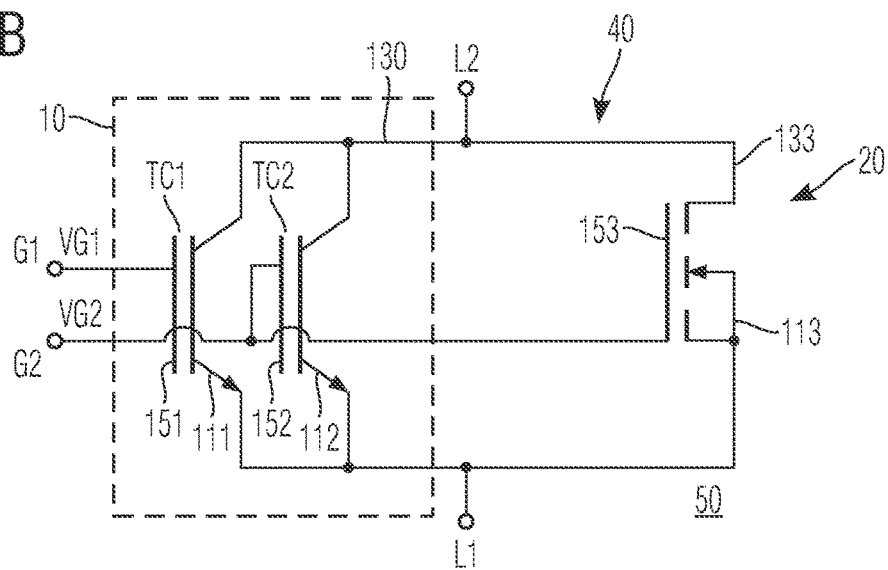
FIG. 1B illustrates a schematic circuit diagram of a semiconductor switching module with a parallel circuit including a unipolar switching device and an IGBT with two independently controlled groups of transistor cells according to an embodiment.

FIG. 1B shows another semiconductor switching module 50 that includes an insulated gate bipolar transistor 10 and a unipolar switching device 20. The insulated gate bipolar transistor 10 includes first transistor cells TC1 and second transistor cells TC2. Each first transistor cell TC1 includes a first gate 151 and a first source 111. Each second transistor cell TC2 includes a second gate 152 and a second source 112. The insulated gate bipolar transistor 10 further includes a common drain/collector structure 130 for the first and second transistor cells TC1, TC2. When the first transistor cells TC1 are turned on, current flows between the first source 111 and the common drain/collector structure 130, and when the second transistor cells TC2 are turned on, current flows between the second source 112 and the common drain/collector structure 130.

The unipolar switching device 20 may be a SiC-MOSFET and includes a third gate 153, a third source 113 and a drain 133. When the unipolar switching device 20 is turned on, current flows between the third source 113 and the drain 133 of the unipolar switching device 20.

A first gate terminal G1 of the semiconductor switching module 50 is electrically connected to the first gates 151 of the first transistor cells TC1. A second gate terminal G2 of the semiconductor switching module 50 is electrically connected to the second gates 152 of the second transistor cells TC2 and to the third gate 153 of the unipolar switching device 20.

A first load terminal L1 of the semiconductor switching module 50 is electrically connected to the first sources 111, the second sources 112 and the third source 113. A second load terminal L2 is electrically connected to the common drain/collector structure 130 of the insulated gate bipolar transistor 10 and the drain 133 of the unipolar switching device 20.

The IGBT 10 is on when at least one of the first and second transistor cells TC1, TC2 is on. The IGBT 10 is off when both the first and the second transistor cells TC1, TC2 are off.

The first and second transistor cells TC1, TC2 and the unipolar switching device 20 may have positive threshold voltages Vth1, Vth2, Vth3. The first transistor cell TC1 turns on, when the first gate signal VG1 becomes active and a voltage level of the first gate signal VG1 exceeds the threshold voltage Vth1 of the first transistor cell TC1.

The first and second transistor cells TC1, TC2 may have the same threshold voltage. In particular, the first transistor cell TC1, the second transistor cells TC2, and the unipolar switching device 20 may have the same or at least approximately the same first threshold voltage Vthn (e.g., a difference between a threshold voltage of each of the first transistor cell TC1, the second transistor cell TC2, and/or the unipolar switching device 20 may be less than a threshold amount).

An active first gate signal VG1 applied to the first gate 151 turns on the first transistor cell TC1. An active second gate signal VG2 applied to the second gate 152 and the third gate 153 turns on the second transistor cell TC2 and the unipolar switching device 20. The first gate 151 and the third gate 153 can be separately controlled such that the semiconductor switching module 50 can be operated in various modes that reduce electrical losses and/or improve device robustness at low additional effort.

The semiconductor switching module 50 may include the IGBT 10 and the unipolar switching device 20 as bare or packaged semiconductor dies mounted side-by-side on a module substrate.

Alternatively, the IGBT 10 and the unipolar switching device 20 may be integrated in a hybrid switching module 40 that may be mounted on the module substrate. The hybrid switching module 40 may include an integrated circuit package that integrates the IGBT and the unipolar switching device as bare semiconductor dies and/or may include an auxiliary substrate on which the IGBT 10 and the unipolar switching device 20 are mounted. The hybrid switching module 40 further includes the first load terminal L1, the second load terminal L2, a first gate terminal G1 connected to the first gate, and a second gate terminal G2 connected to the second gate and the third gate.

The semiconductor switching module 50 may be a power module including further components of a half-bridge or full-bridge circuit for power conversion and/or the control of inductive loads.

Figure 2A:
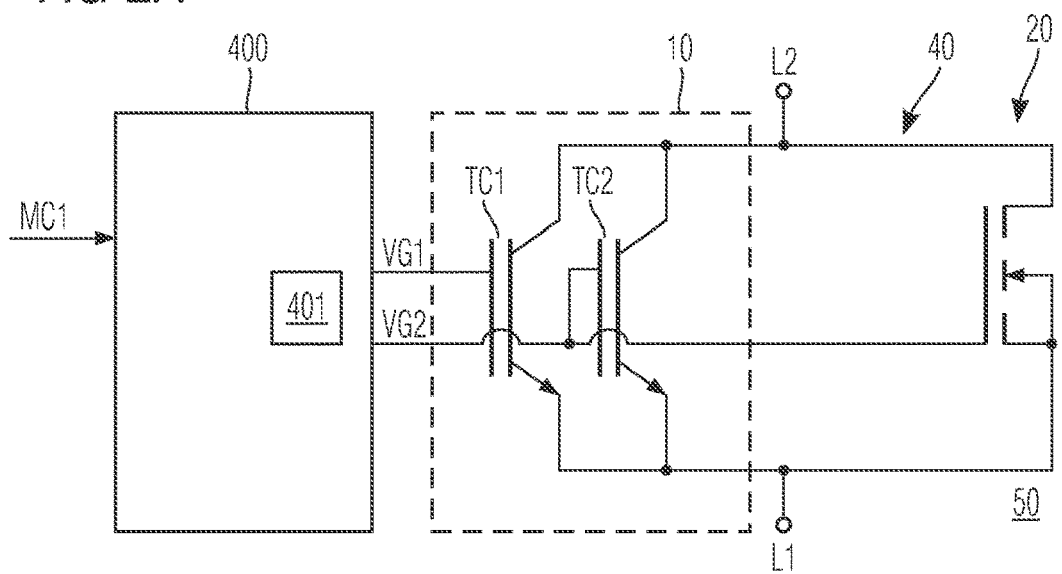
FIG. 2A illustrates a schematic circuit diagram of a semiconductor switching module according to an embodiment including a gate driver circuit and two hybrid switching modules.
Figure 2B:
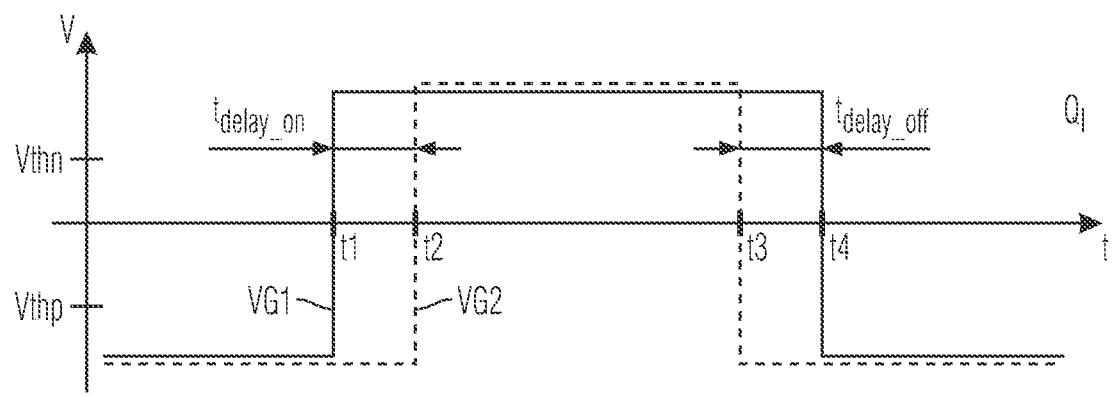
FIG. 2B illustrates a schematic time diagram illustrating two control signals of the semiconductor switching module of FIG. 2A.
Figure 2C:
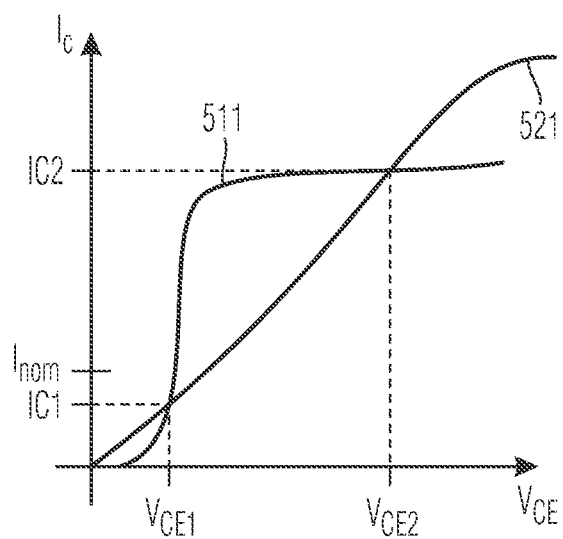
FIG. 2C illustrates simplified forward current/voltage characteristics of an IGBT and a silicon carbide (SiC)-MOSFET to discuss the effects of the semiconductor switching module of FIG. 2A.

FIG. 2A to 2C refer to an embodiment focusing on reducing conduction losses.

To this purpose, the insulated gate bipolar transistor 10 and the unipolar switching device 20 as described with reference to FIG. 1 may be combined with a conduction loss reduction unit 401 as illustrated in FIG. 2A.

The conduction loss reduction unit 401 may be realized in hardware and/or software as a functional module of a higher level control unit. Alternatively, the semiconductor switching assembly 50 includes a gate driver circuit 400 and the conduction loss reduction unit 401 may be integrated in the gate driver circuit 400 as illustrated in FIG. 2A.

The gate driver circuit 400 generates and outputs the first and second gate signals VG1, VG2 and can be operated in various modes with different timings and/or with different voltage levels for the first and second gate signals VG1, VG2.

The conduction loss reduction unit 401 may be permanently active or may be controllable. For example, the gate driver circuit 400 includes an input interface that receives a first mode control signal MC1. As long as the first mode control signal MC1 is inactive, the conduction loss reduction unit 401 is inactive and the gate driver circuit 400 may operates in a standard mode.

In the standard mode, the gate driver circuit 400 may simultaneously turn on the unipolar switching device 20, the first transistor cells TC1 and the second transistor cells TC2 and may simultaneously turn off the unipolar switching device 20, the first transistor cell TC1 and the second transistor cell TC2.

An active first mode control signal MC1 activates the conduction loss reduction unit 401 such that the gate driver circuit 400 operates in the conduction loss reduction mode.

FIG. 2B shows the timing of the first and second gate signals VG1, VG2 in the conduction loss reduction mode. The gate driver circuit 400 turns on the first gate signal VG1 at t=t1, turns on the second gate signal VG2 at t=t2 after t=t1, turns off the second gate signal VG2 at t=t3 after t=t2, and turns off the first gate signal VG1 at t=t4 after t=t3.

The conduction loss reduction unit 401 controls the first and second gate signals VG1, VG2 such that the rising edge of the second gate signal VG2 lags the rising edge of the first gate signal VG1 by a turn-on delay tdelay_on and such that the falling edge of the first gate signal VG1 lags the falling edge of the second gate signal VG2 by the turn-off delay tdelay_off.

The unipolar switching device 20 provides a low impedance path in parallel with the first and second transistor cells TC1, TC2 such that conduction losses can be reduced, especially for light load conditions.

Since the unipolar switching device 20 may be on (only, for example) for a period of time between t=t2 and t=t3, the unipolar switching device 20 switches exclusively under low forward bias such that no switching losses occur in the unipolar switching device 20. Therefore, the unipolar switching device 20 can be designed exclusively for low conduction losses and there may be no need to compromise with requirements for reduced switching losses in the unipolar switching device 20.

In addition, turning off the second transistor cell TC2 prior to the first transistor cell TC1 reduces the charge carrier plasma in the IGBT 10 at the end of the on-state of the IGBT such that switching losses in the IGBT 10 are reduced.

In FIG. 2C, line 511 shows a typical output characteristic of an IGBT and line 511 shows the output characteristic of an SiC-MOSFET as an example for a unipolar switching device.

For a load current IC smaller than IC1, the voltage drop across the SiC-MOSFET is smaller than the voltage drop across the IGBT, whereas a load current IC greater than IC1 and smaller than IC2 causes a smaller voltage drop across the IGBT than across the SiC-MOSFET. Therefore, the SiC-MOSFET reduces conduction losses of the semiconductor switching module 50 in particular under light load conditions.

In addition, the SiC-MOSFET turns on and off under a defined bias voltage, allowing a SiC-MOSFET with greater total channel width and larger saturation current to be used than if the SiC-MOSFET were switched synchronously with all transistor cells of the IGBT, as would be the case with standard single-gate IGBTs.

Figure 3A:
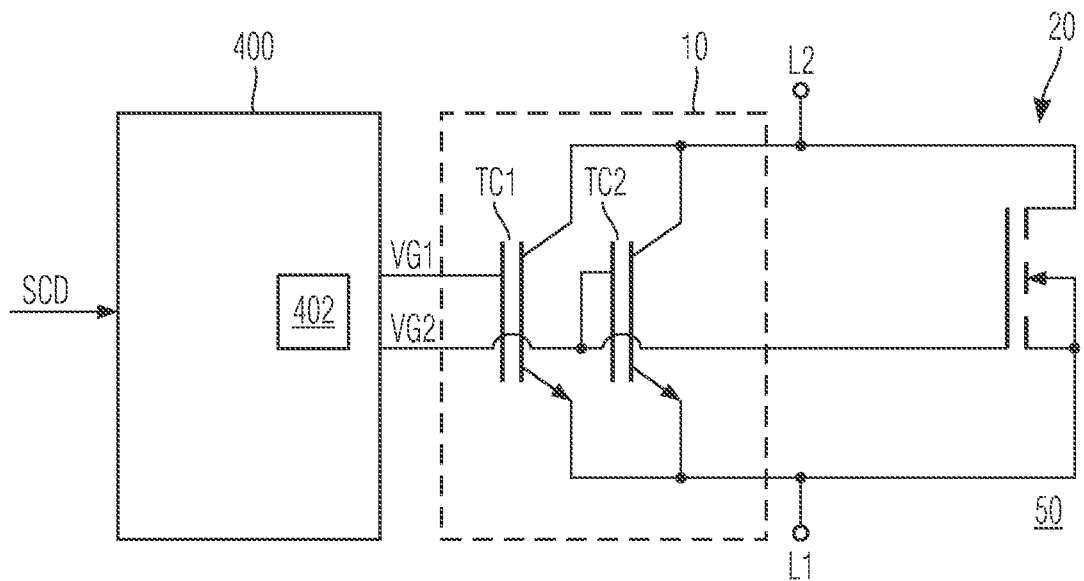
FIG. 3A illustrates a schematic circuit diagram of a semiconductor switching module according to an embodiment with a gate driver circuit that enables short-circuit protection.
Figure 3B:
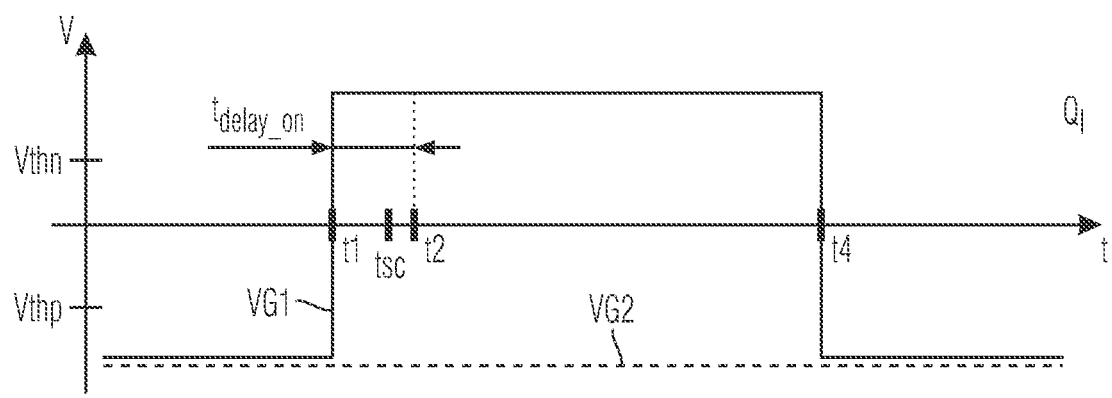
FIG. 3B illustrates a schematic time diagram illustrating two control signals of the semiconductor switching module of FIG. 3A.

FIG. 3A and FIG. 3B concern short-circuit protection.

FIG. 3A shows a short-circuit protection unit 402 integrated in a gate driver circuit 400. Alternatively, the short-circuit protection unit 402 may be a functional module of a higher level control unit. In both cases, the short-circuit protection unit 402 may be realized in hardware, software or may include a combination of both.

A short-circuit detection circuit monitors a sense voltage or sense current, the amplitude of which can be used to detect a short-circuit condition, and outputs an active short-circuit detection signal SCD when a short-circuit condition is detected. The active short-circuit detection signal SCD activates the short-circuit protection unit 402 such that the gate driver circuit 400 starts to operate in a short-circuit protection mode.

In FIG. 3B, the short-circuit condition is detected at t=tsc after t=t1. At t=tsc the gate driver circuit changes into the short-circuit protection mode. In the short-circuit protection mode, the second gate signal VG2 remains inactive after t=t2. Turning on the unipolar switching device 20 and the second transistor cell TC2 is omitted. The first gate signal VG1 may be unchanged as illustrated. Alternatively, the short-circuit protection mode controls the first gate signal VG1 in the same way as the second gate signal VG2 and changes the voltage level of the first gate signal VG1 to below Vthp at t=tsc.

Figure 4A:
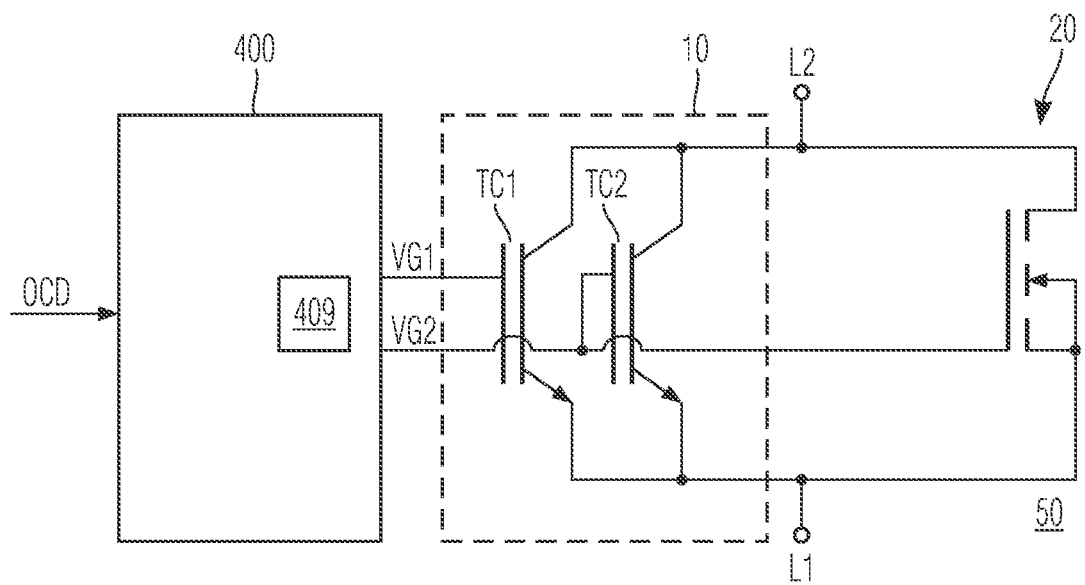
FIG. 4A illustrates a schematic circuit diagram of a semiconductor switching module according to an embodiment with a gate driver circuit that enables overcurrent protection.
Figure 4B:
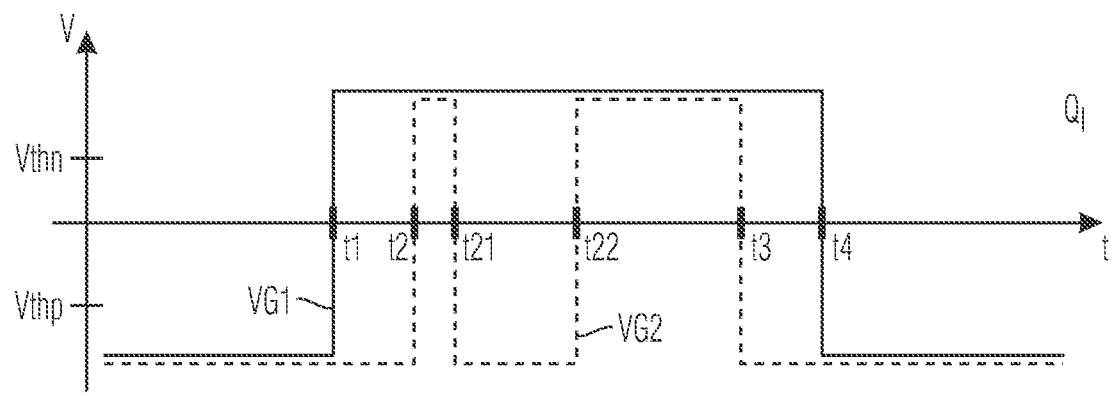
FIG. 4B illustrates a schematic time diagram illustrating two control signals of the semiconductor switching module of FIG. 4A.

FIG. 4A and FIG. 4B are related to overcurrent protection.

FIG. 4A shows an overcurrent protection unit 409 integrated in a gate driver circuit 400. Alternatively, the overcurrent protection unit 409 may be a functional module of a higher level control unit. In both cases, the overcurrent protection unit 409 may be realized in hardware, software or may include a combination of both.

An overcurrent detection circuit monitors a sense voltage or sense current, the amplitude of which can be used to detect an overcurrent condition, and outputs an active overcurrent detection signal OCD when an overcurrent condition is detected. The active overcurrent detection signal OCD activates the overcurrent protection unit 409 such that the gate driver circuit 400 starts to operate in an overcurrent protection mode.

FIG. 4B shows the first and second gate signals VG1, VG2 changing into the overcurrent protection mode at t=t21 after turning on the second gate signal VG2 at t=t2. In the overcurrent protection mode, the second gate signal VG2 remains inactive until the overcurrent condition ends and the gate driver circuit 400 exits the overcurrent protection mode. The overcurrent condition may end at t=t22, wherein t22 may be prior to t=t4 as illustrated, or later. For example, the overcurrent protection mode may end with t=t4 such that the overcurrent detection circuit returns to the initial state prior to the next switching pulse of the first gate signal VG1.

Figure 5:
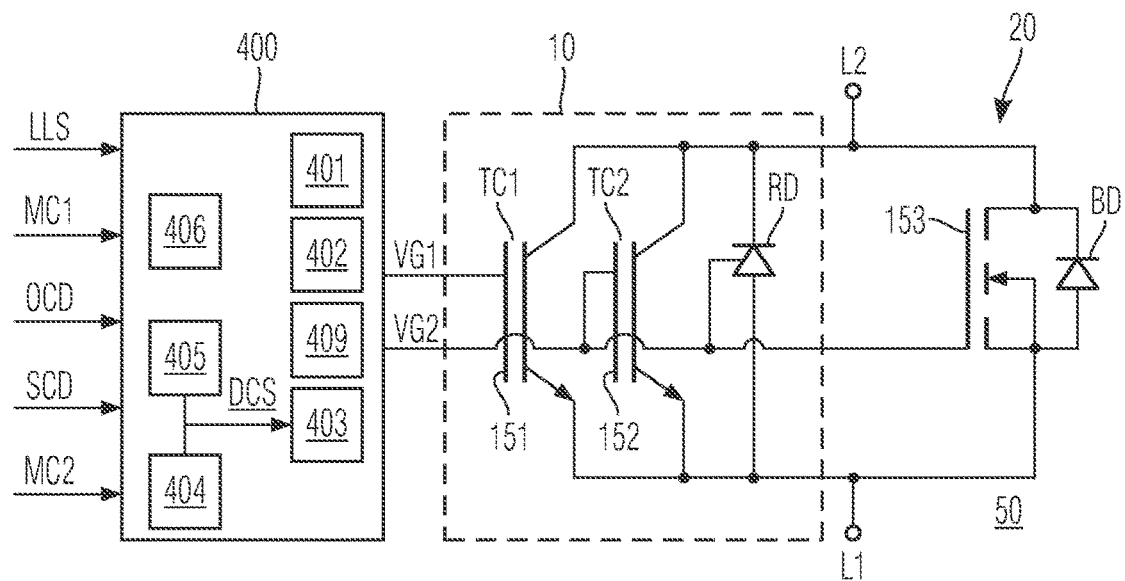
FIG. 5 illustrates a schematic circuit diagram of a semiconductor switching module according to an embodiment including a gate driver circuit that enables various operation modes.

FIG. 5 refers to a semiconductor switching assembly 50 that includes a reverse conducting IGBT 10 with controllable reverse diode structures RD that are electrically connected in parallel to the first and second transistor cells TC1, TC2. The second gate signal VG2 switches the operation mode of the reverse diode structures RD between a standard diode mode and an enhanced diode mode, wherein a forward conductivity of the reverse diode structures RD in the enhanced diode mode is higher than in the standard diode mode.

The unipolar switching device 20 is shown with a body diode BD and the gate driver circuit 400 is shown with various control units for various modes to control the IGBT 10 and the unipolar switching device 20.

In particular, the gate driver circuit 400 includes a conduction loss reduction unit 401 as described with reference to FIG. 2A, a short-circuit protection unit 402 as described with reference to FIG. 3A and an overcurrent protection unit 409 as described with reference to FIG. 4A.

A reverse current control unit 403 switches the reverse diode structure RD into the enhanced diode mode in response to a level change of a diode control signal DCS. The reverse current control unit 403 facilitates to select one of the operation modes of the reverse diode structure RD as standard operation mode for a certain application and/or to change the operation mode in response to an operator command or a change of internal conditions. Operating the reverse diode structures RD in the enhanced diode mode may extend operational lifetime of the unipolar switching device and operation in the standard diode mode may improve power efficiency of the semiconductor switching module 50.

A diode mode control unit 404 activates the diode control signal DCS in response to an active second mode control signal MC2 that may be activated by a change of an internal condition like reaching a predefined operating point, expiring a predefined operating time, reaching a predefined temperature or temperature budget.

A surge current control unit 405 activates the diode control signal DCS in response to detection of a surge current event.

A light load mode unit 406 turns on the unipolar switching device 20 and the second transistor cells TC2 before the first transistor cells TC1 are turned on or omits turning on the first transistor cells TC1 in dependence on an active light load signal LLS. The light load mode may be (only, for example) active under forward bias (quadrant I operation mode), or both under forward and reverse bias (quadrant I and III operation modes).

Increasing the load current portion of the unipolar switching device in particular under light load conditions may further reduce overall electrical losses. The light load mode unit 406 may switch between different light load modes in dependence on control signals generated by user setting or as a consequence of a change of an internal state.

Another control unit may be a control unit for enhanced modes for improving the IGBT lifetime. The control unit for enhanced modes for improving the IGBT lifetime may switch between different enhanced modes for improving the IGBT lifetime in dependence on control signals generated by user setting or as a consequence of a change of an internal state.

The gate driver circuit 400 may include one, some, or all of the control units.

Figure 6:
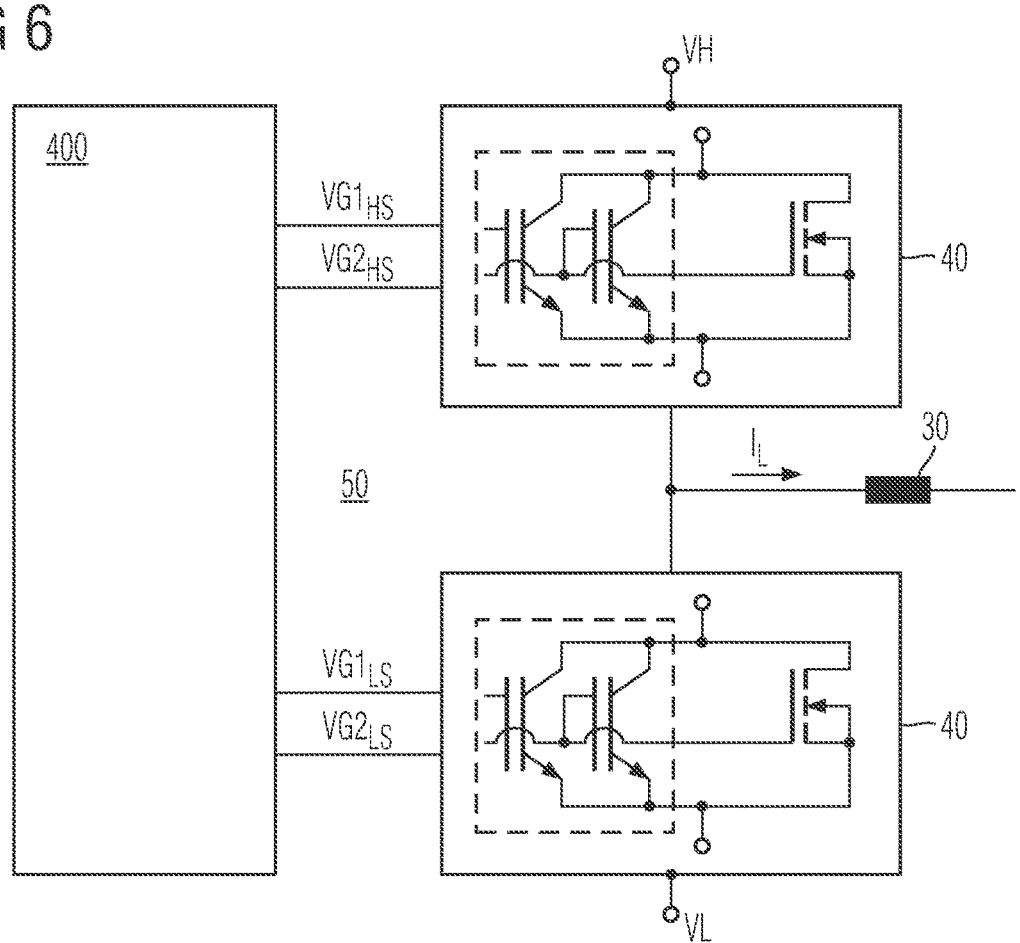
FIG. 6 illustrates a schematic circuit diagram of a semiconductor switching module for driving hybrid switching assemblies in a half—bridge configuration according to another embodiment.

In FIG. 6 the semiconductor switching module 50 may be a smart power module with two hybrid switching modules 40 in a half-bridge configuration. An inductive load 30 is connected to the node between the two hybrid switching modules 40. A gate driver circuit 400 configured as dual gate driver generates and outputs the first and second gate signals VG1HS, VG2HS for the hybrid switching modules 40 forming the high-side switch and the first and second gate signals VG1LS, VG2LS for the hybrid switching modules 40 forming the low-side switch. The gate driver circuit 400 can include any combination of the control units described for the semiconductor switching module 50 illustrated in FIG. 5. The semiconductor switching module 50 may include further components of a half-bridge or full-bridge circuit for power conversion and/or the control of inductive loads.

The semiconductor switching module 50 may include the IGBT 10, the unipolar switching device 20, and, if applicable, the gate driver circuit 400 as bare semiconductor dies or as packaged semiconductor dies.

The semiconductor switching module 50 includes a module substrate, wherein the components of the hybrid switching modules 40 and, if applicable, the gate driver circuit 400 are mounted as bare dies or as packaged semiconductor dies side-by-side on the same side of the module substrate. Alternatively, the components of each hybrid switching modules 40 are integrated in one integrated circuit package and the hybrid switching modules and, if applicable, the gate driver circuit 400 are mounted side-by-side on the same side of the module substrate.

Figure 7:
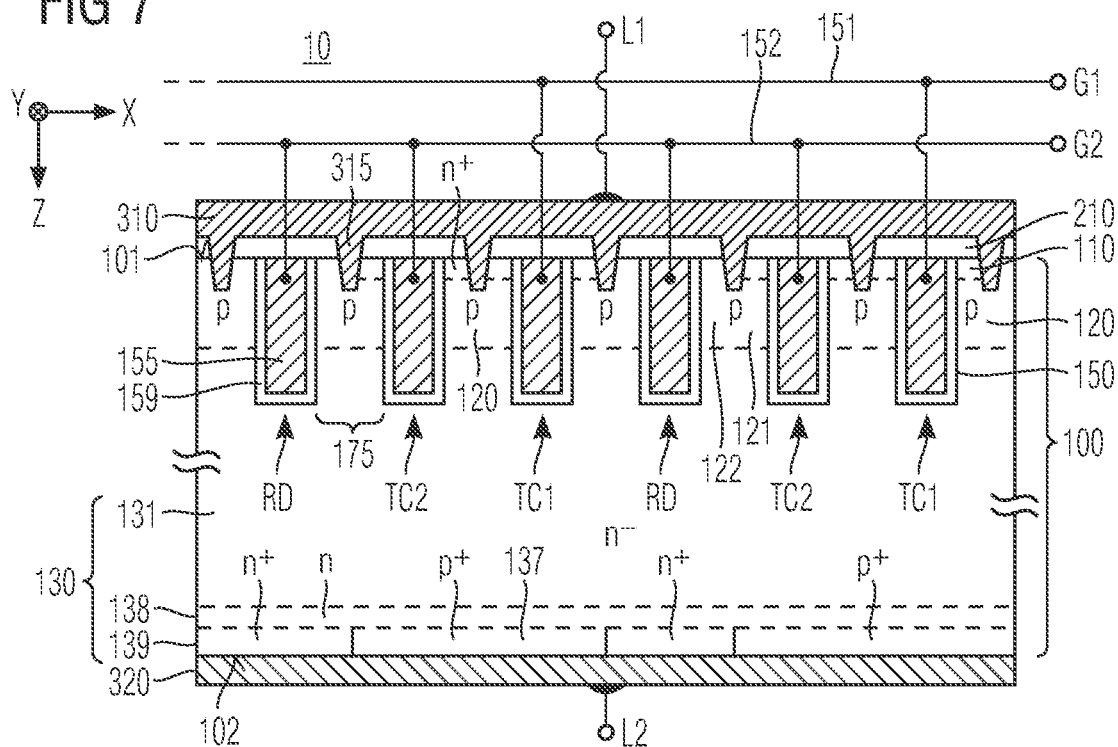
FIG. 7 illustrates a schematic vertical cross-sectional view of a portion of a reverse conducting insulated gate bipolar transistor (RC-IGBT) with transistor cells and controllable reverse diode structures usable for a semiconductor switching module according to an embodiment.
Figure 8:
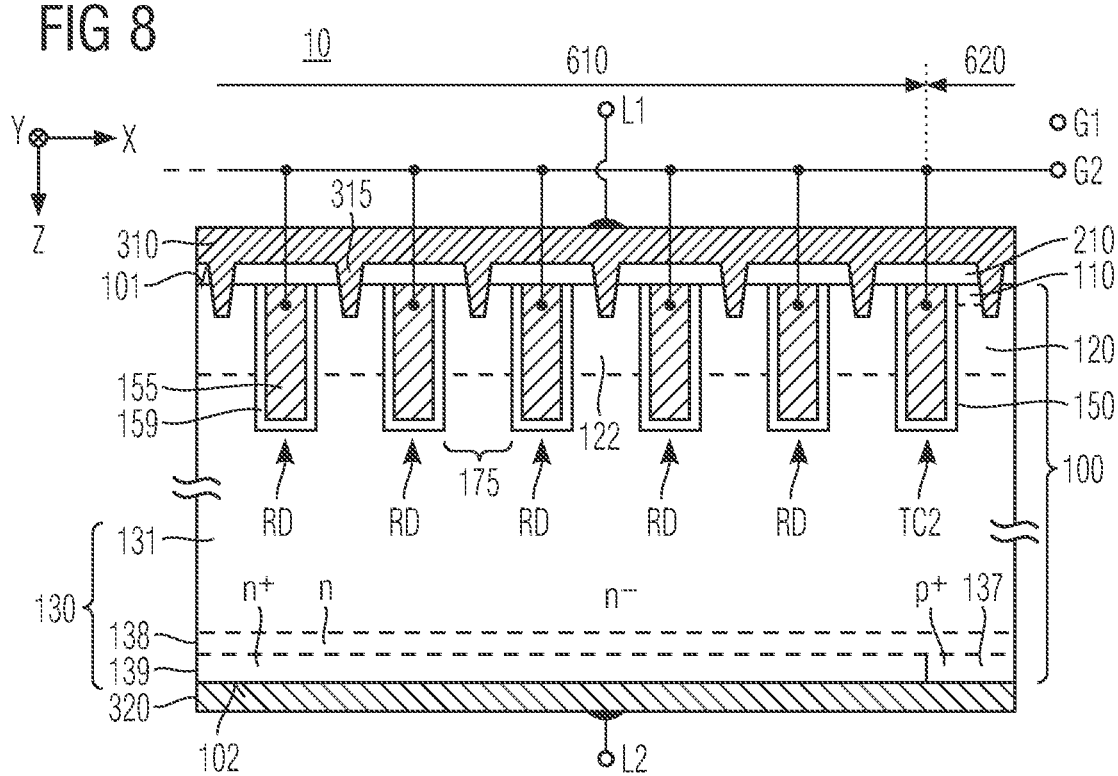
FIG. 8 illustrates a schematic vertical cross-sectional view of a portion of another RC-IGBT with two independently controlled groups of transistor cells usable for a semiconductor switching module according to an embodiment with a diode region.
Figure 9:
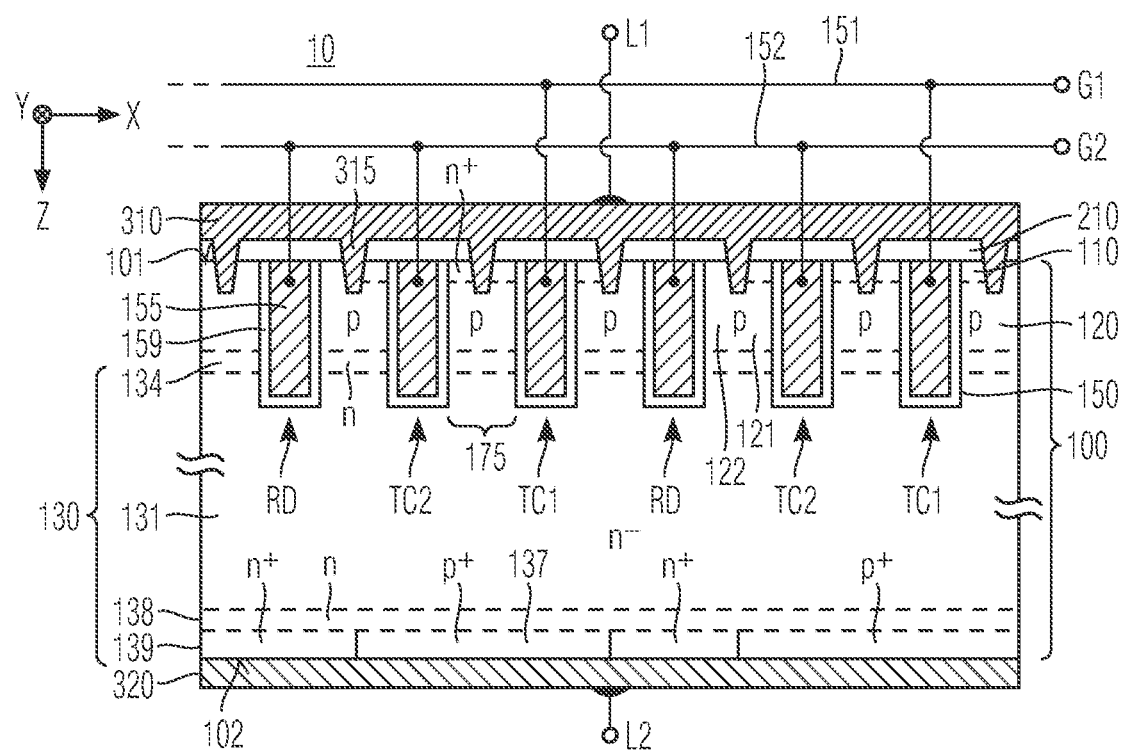
FIG. 9 illustrates a schematic vertical cross-sectional view of a portion of another RC-IGBT with two independently controlled groups of transistor cells usable for a semiconductor switching module according to an embodiment with barrier layer.

FIG. 7 to FIG. 9 show vertical cross-sectional views of IGBTs 10 with first and second transistor cells TC1, TC2 and controllable reverse diode structures RD suitable for a semiconductor switching module 50 as described with reference to FIG. 5. The illustrated examples refer to n channel IGBTs with a first conductivity type being n conductivity and a second conductivity type being p conductivity. For p channel IGBTs, the conductivity type of each mentioned doped region changes to the complementary one.

Each IGBT 10 includes a semiconductor body 100 mainly formed from a single crystalline semiconductor material, for example silicon (Si). The semiconductor body 100 has a planar first surface 101 on the front side. In a horizontal plane parallel to the first surface 101, the semiconductor body 100 has a rectangular shape. A normal to the first surface 101 defines a vertical direction parallel to a z-axis. Directions orthogonal to the vertical direction are lateral directions (horizontal directions) parallel to an x-axis and a y-axis.

The semiconductor body 100 includes a multi-layer drain/collector structure 130. The drain/collector structure 130 extends horizontally through the semiconductor body 100 and includes a lightly doped drift region 131 of the first conductivity type, a heavily doped collector layer formed along a second surface 102 on the backside of the semiconductor body 100, and a buffer layer 138 of the first conductivity type between the drift region 131 and the collector layer, wherein a mean net dopant concentration in the buffer layer 138 may be at least twice as high as in the drift region 131. The collector layer includes at least one first zone 139 of the first conductivity type and at least one second zone 137 of the complementary second conductivity type, wherein each first zone 139 and each second zone 137 extends from the buffer layer 138 to the second surface 102.

Trench electrode structures 150 extend from the first surface 101 into the drift region 131. Each trench electrode structure 150 includes a trench electrode 155 and a trench dielectric 159 separating the trench electrode 155 and the semiconductor body 100. The trench electrode structures 150 may be stripe-shaped with a horizontal longitudinal extension along the y-axis and a width extension along the x-axis. Alternatively, the trench electrode structures 150 may have approximately equal dimensions along both horizontal axes.

Doped zones 120 of the second conductivity type are formed in semiconductor mesas 175 between neighboring trench electrode structures 150. The doped zones 120 are formed in the semiconductor mesas between the first surface 101 and the drain/collector structure 130. In at least some of the semiconductor mesas 175, source regions 110 of the first conductivity type are formed between the first surface 101 and the doped zones 120. An interlayer dielectric 210 is formed on the first surface 101 and on portions of the trench electrodes structures 150.

At the front side, contact structures 315 extend from a first metallization 310 through openings in the interlayer dielectric to or into the semiconductor body 100 and form ohmic contacts with the source regions 110 and the doped zones 120, which may include heavily doped contact sections. The first metallization 310 may form or may be electrically connected with a first load terminal L1.

Opposite to the front side, a second metallization 320 and the first and second zones 139, 137 of the collector layer form ohmic contacts. The second metallization 320 may form or may be electrically connected with a second load terminal L2.

Each first transistor cell TC1 includes first trench electrode structures 150, wherein the trench electrodes 155 of the first trench electrode structures 150 form a first gate 151 electrically connected to a first gate terminal G1, and wherein each first trench electrode structure 150 is in direct contact with at least one source region 110 along a sidewall portion. An active first gate signal VG1 applied to the first gate terminal G1 controls a current flow along the first trench electrode structure 150 between the at least one source region 110 and the drain/collector structure 130.

Each second transistor cell TC2 and each reverse diode structure RD includes a second trench electrode structure 150, wherein the trench electrodes 155 of the second trench electrode structures 150 form a second gate 152 electrically connected to a second gate terminal G2.

Each second transistor cell TC2 includes at least one source region of the first conductivity type in direct contact with a sidewall portion of a second trench electrode structure 150. An active second gate signal VG2 applied to the second gate terminal G2 controls a current flow along the second trench electrode structure 150 of the second transistor cell TC2 between the at least one source region 110 and the drain/collector structure 130.

In the reverse diode structures RD of the semiconductor switching module 50, an active second gate signal VG2 applied to the second gate terminal G2 does not control a current flow in the forward direction along the second trench electrode structure 150 of the reverse diode structure RD between the first load terminal L1 and the drain/collector structure 130, because either a source region 110 may not be formed along the sidewall of the second trench electrode structure 150 and/or a source region 110 formed along the sidewall of the second trench electrode structure 150 may not be electrically connected to the first metallization 310. In the reverse direction, the voltage level of the second gate signal VG2 affects the charge carrier plasma density and the forward voltage of the reverse conducting diode of the IGBT.

Each doped zone 120 may include two first portions 121, two second portions 122, or one first portion 121 and one second portion 122, wherein each first portion 121 separates a source region 110 electrically connected to the first metallization 310 from the drain/collector structure 130 along a sidewall of a second trench electrode structure 150. The first portions 121 form body regions 121 of the first and second transistor cells TC1, TC2. Each second portion 122 separates such a source region 110 that is not connected to the first metallization 310, from the drain/collector structure 130 along a sidewall of a second trench electrode structure 150 and/or extends contiguously from the first surface 101 to the drain/collector structure 130 along a sidewall of a second trench electrode structure 150. The second portions 122 form doped diode zones 122.

A sufficiently negative potential applied to the trench electrodes 155 of the reverse diode structures RD accumulates holes in accumulation layers extending along the sidewalls of the second trench electrode structures 150 of the reverse diode structures RD through the doped diode zones 122 and invokes the enhanced diode mode. The accumulation layers improve the forward conductivity of the reverse diode structures RD.

In particular, the reverse diode structures RD are in an enhanced diode mode, when the voltage level of the second gate signal VG2 is more negative than a negative second threshold voltage Vthp at which the accumulation layers form (VG2<Vthp). For a voltage level of the second gate signal VG2 above the negative second threshold voltage Vthp (VG2>Vthp), the reverse diode structures are in a standard diode mode with lower forward conductivity.

FIG. 7 shows an example for an evenly distribution of the reverse diode structures RD across the semiconductor body 100. In particular, the first and second transistor cells TC1, TC2 and the reverse diode structures are arranged in a repeating pattern of a unit cell that includes at least one first transistor cell TC1, at least one second transistor cell TC2 and at least one reverse diode structure RD. In the example of FIG. 7, the unit cell includes one first transistor cell TC1, one second transistor cell TC2 and one reverse diode structure RD.

The first zones 139 and second zones 137 of the collector layer may be evenly distributed. In the illustrated embodiment, the number of first zones 139 and the number of second zones 137 are equal to the number of unit cells and the first zones 139 are vertically aligned with the reverse diode structures RD.

The reverse diode structure RD, the first transistor cells TC1, and the second transistor cells TC2 are strongly interleaved with each other such that the reverse diode structures RD and the first and second transistor cells TC1, TC2 are strongly thermally coupled to each other.

In FIG. 8, the reverse diode structures RD are concentrated in one or more contiguous diode regions 610 of the semiconductor body 100. The collector layer may include a number of first zones 139 equal to the number of the diode regions 610, wherein each first zone 139 is vertically aligned to one of the diode regions 610. Each diode region 610 includes a plurality of reverse diode structures RD and is devoid of first and second transistor cells TC1, TC2.

The insulated gate bipolar transistor 10 further includes at least one transistor region 620, wherein the one or more transistor regions 620 are devoid of reverse diode structures RD and include all first and second transistor cells TC1, TC2.

The reverse diode structures RD and the first and second transistor cells TC1, TC2 are (only, for example) weakly thermally coupled.

The IGBT 10 in FIG. 9 differs from the IGBT 10 in FIG. 7 in that the drain/collector structure 130 further includes a barrier layer 134 of the first conductivity type formed between the doped zones 120 and the drift region 131.

Figure 10:
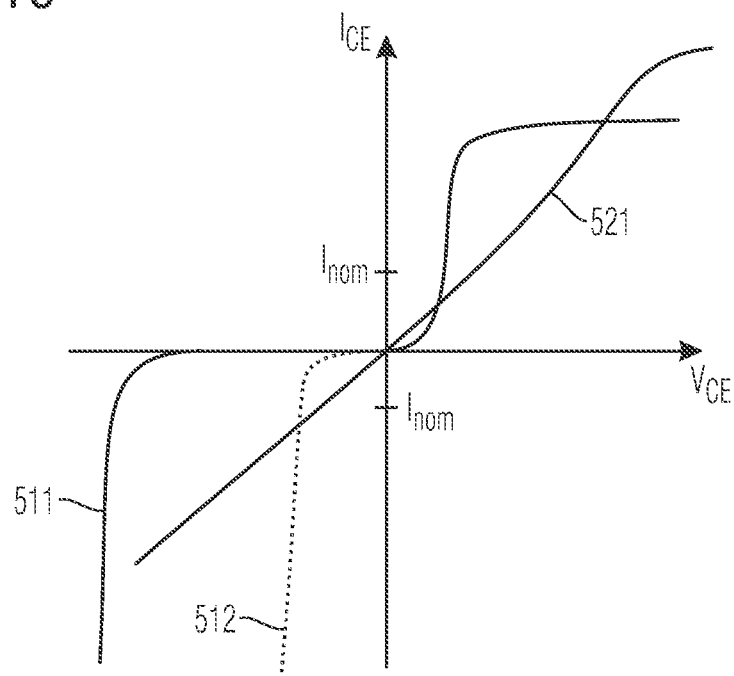
FIG. 10 and FIG. 11 illustrate simplified forward current/voltage characteristics of IGBTs and SiC-MOSFETs to discuss the effects of embodiments of semiconductor switching modules with controllable reverse diode structures.

In FIG. 10, line 521 shows the first and third quadrant output characteristic of a SiC-MOSFET as an example for a unipolar switching device, line 511 shows the first and third quadrant output characteristic of an RC-IGBT operating in a standard diode mode and line 512 shows the output characteristics of the same IGBT operating in the enhanced diode mode. In the third quadrant, line 512 crosses line 521 for lower reverse currents than line 511. Therefore, in the enhanced diode mode, the IGBT takes over the reverse current at a lower current level such that excessive reverse current for the SiC-MOSFET can be avoided.

Figure 11:
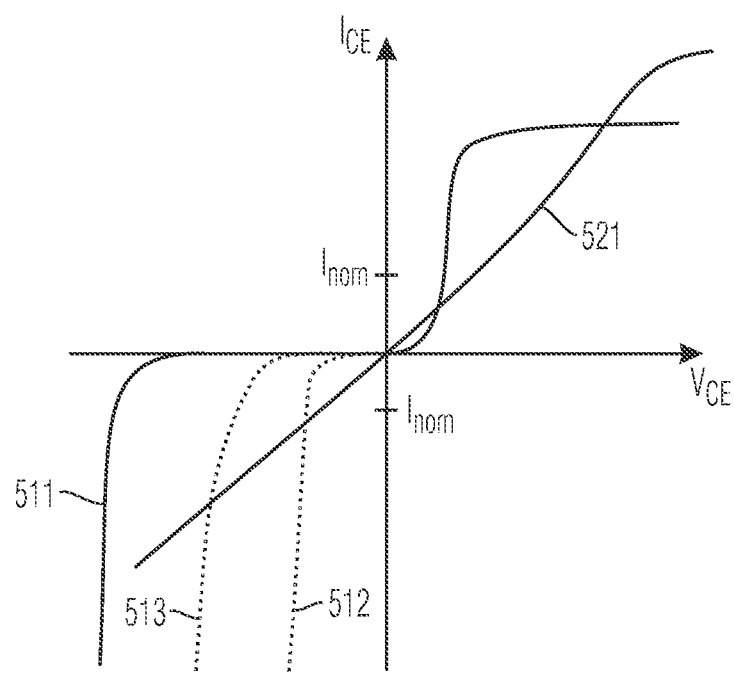

FIG. 11 shows a further line 513 showing the third quadrant output characteristic of an RC-IGBT operating at a voltage level of the second gate signal lower than the first threshold voltage Vthn and higher than the voltage level used for the operation method indicated by line 512.

The different voltage levels for the second gate signal VG2 facilitate further adjustments in the reverse biased mode.

Figure 12:
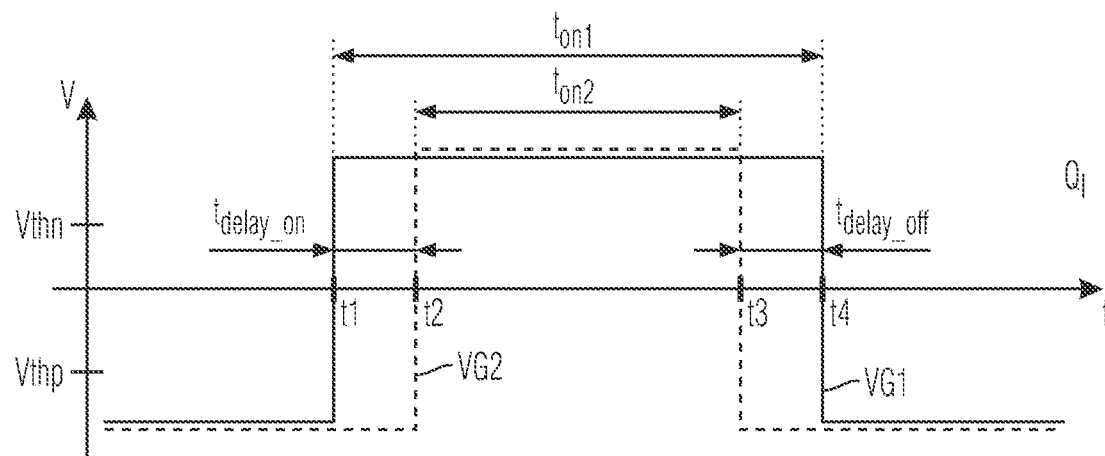
FIG. 12, FIG. 13 and FIG. 14 illustrate time diagrams of control signals of a semiconductor switching module according to various embodiments related to controllable reverse diode structures.
Figure 12:
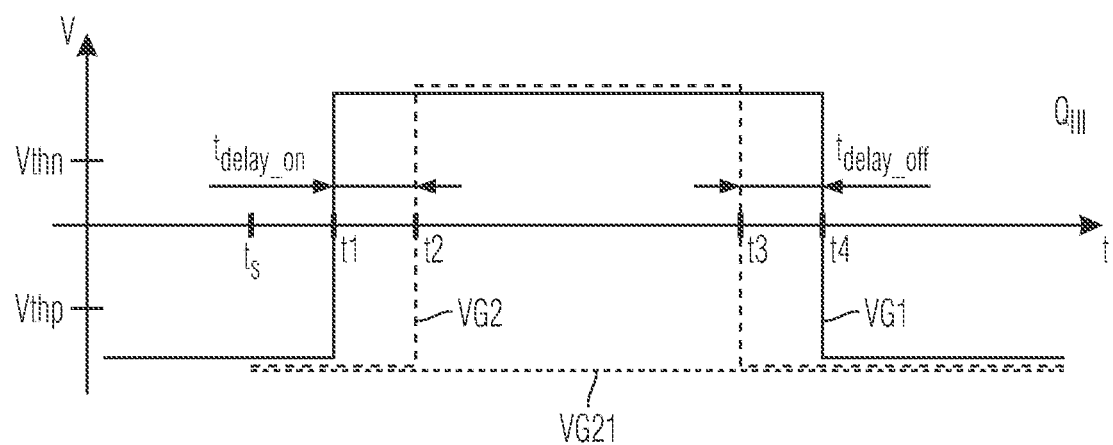
Figure 13:
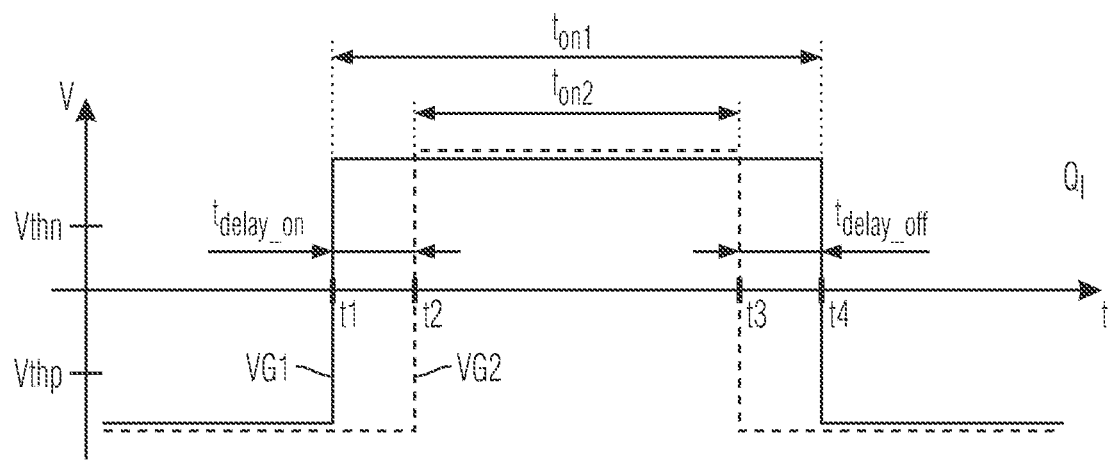
Figure 13:
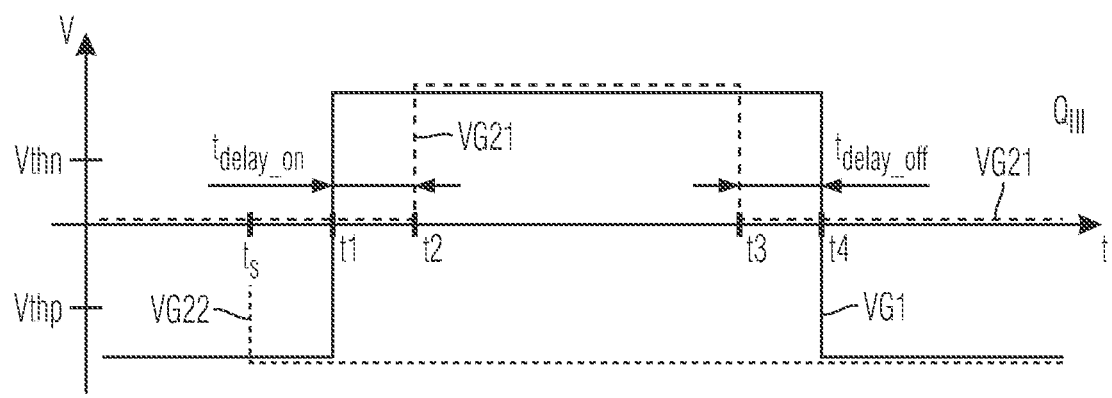
Figure 14:
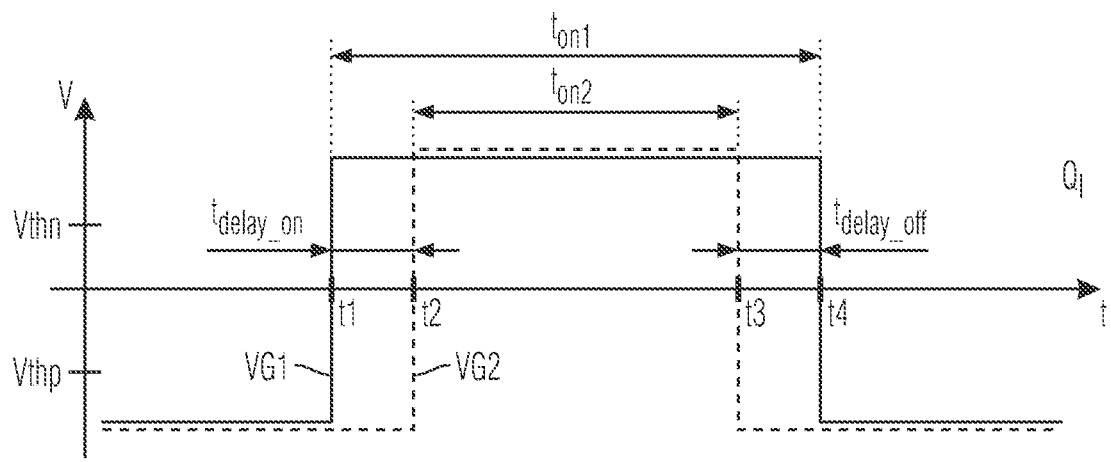
Figure 14:
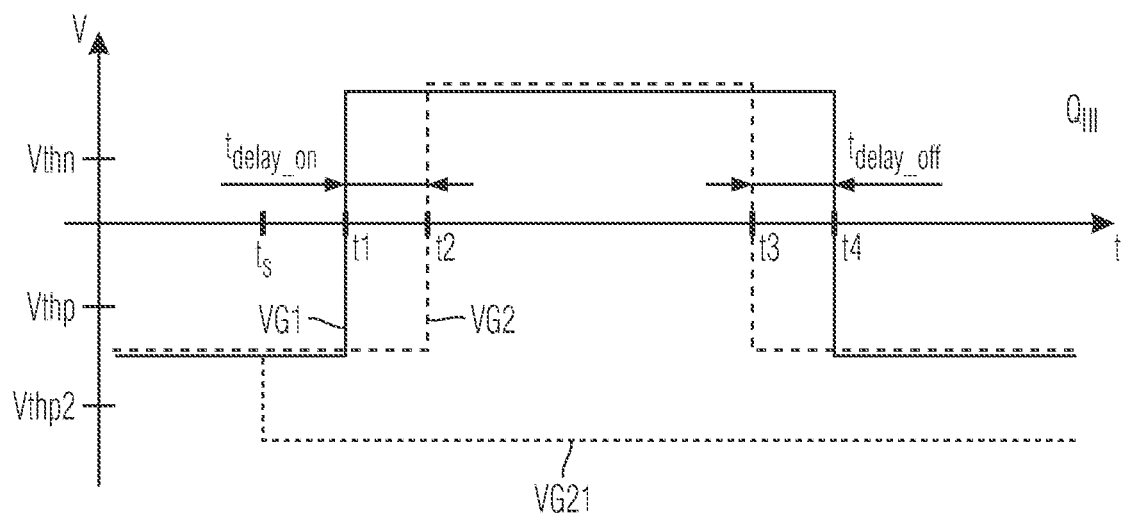

Each of FIG. 12 to FIG. 14 shows two time diagrams for the first and second gate signals VG1, VG2 for operation modes using inter alia the controllable reverse diode structures RD described with reference to FIG. 7, FIG. 8 and FIG. 9. The upper time diagram in each of FIG. 12 to FIG. 14 shows the first and second gate signals VG1, VG2 under forward bias (quadrant I operation mode). The lower time diagram in each of FIG. 12 to FIG. 14 shows the first and second gate signals VG1, VG2 under reverse bias (quadrant III operation mode).

FIG. 12 shows the time diagrams for when the gate driver circuit 400 of FIG. 5 operates in a surge current control mode. When the voltage levels of the first and second gate signals VG1, VG2 exceed the first threshold voltage Vthn, the first and second transistor cells TC1, TC2 turn on. When the first and second transistor cells TC1, TC2 are off, the voltage levels of the first and second gate signals VG1, VG2 are more negative than the second threshold voltage Vthp.

The lower diagram shows the first gate signal VG1 and the second gate signal VG2 under reverse bias (quadrant III operation) in a standard operation method. Since the second gate signal VG2 controls the trench electrodes of the reverse diode structures RD, the diode reverse structures are in a standard diode mode during the on-time ton2 of the second transistor cells TC2 between t=t2 and t=t3 and may have a higher forward voltage drop than the body diode of the unipolar switching device 20 such that the unipolar switching device 20 carries a great portion of the reverse current.

In response to detection of a surge current event at t=ts, the surge current control mode becomes active. In the surge current control mode, the gate driver circuit outputs a modified second gate signal VG21 that remains at a voltage level below the second threshold voltage Vthp as long as the surge current control mode is active. Thus the reverse diode structures RD may remain in the enhanced diode mode for the complete on-time ton2 of the second transistor cells TC2. In the enhanced diode mode, the forward voltage of the reverse diode structure RD may be lower, such as lower than the forward voltage of the body diode of the unipolar switching device such that the reverse diode structures RD take a greater part of the surge current and the unipolar switching device can be efficiently protected against thermal degradation caused by surge current events.

In more detail, the gate driver circuit controls the first gate signal VG1 such that the voltage level of the first gate signal VG1 may be higher than the first threshold voltage Vthn for an on-time ton1 between t=t1 and t=t4 and lower than the second threshold voltage Vthp outside the on-time ton1 of the first transistor cells TC1 both under forward bias (quadrant I operation mode) and under reverse bias (quadrant III operation mode). The gate driver circuit 400 further controls the second gate signal VG2 such that the voltage level of the second gate signal VG2 may be higher than the first threshold voltage Vthn for the on-time ton2 between t=t2 and t=t3 and lower than the second threshold voltage Vthp outside the on-time ton2 of the second transistor cells TC2 both under forward bias (quadrant I operation mode) and under reverse bias (quadrant III operation mode).

When a surge current event is detected at t=ts, the gate driver circuit may control the modified second gate signal VG21 such that the voltage level of the modified second gate signal VG21 may be lower than the second threshold voltage Vthp even for at least a part of the on-time ton2, during which the second transistor cells TC2 are otherwise on under reverse bias (quadrant III operation mode).

In FIG. 13, the gate driver circuit controls the first gate signal VG1 and the first transistor cells TC1 in the same way as in the example of FIG. 12. Further, the gate driver circuit controls the second gate signal VG2 under forward bias in the same way as in the example of FIG. 12 and controls the second gate signal VG21 under reverse bias in such a way that the second gate signal VG21 may be higher than the first threshold voltage Vthn for the on-time ton2 and lower than the first threshold voltage Vthn but higher than the second threshold voltage Vthp outside the on-time ton2 of the second transistor cells TC2.

When a surge current event is detected at t=ts, the gate driver circuit 400 controls a modified second gate signal VG22 such the voltage level of the modified second gate signal VG22 may be lower than the second threshold voltage Vthp even for at least a part of the on-time ton2, during which the second transistor cells TC2 are otherwise on under reverse bias.

In FIG. 14, the gate driver circuit controls the first gate signal VG1 and the first transistor cells TC1 in the same way as in the examples of FIG. 12. Further, the gate driver circuit controls the second gate signal VG2 such that the voltage level of the second gate signal VG2 may be higher than the first threshold voltage Vthn for the on-time ton2 and lower than the second threshold voltage Vthp but higher than a third threshold voltage Vthp2 outside the on-time ton2 of the second transistor cells TC2, both under forward bias (quadrant I operation mode) and under reverse bias (quadrant III operation mode).

When a surge current event is detected at t=ts, the gate driver circuit 400 controls a modified second gate signal VG21 such that the voltage level of the modified second gate signal VG21 may be lower than the third threshold voltage Vthp2 even for at least a part of the on-time ton2, during which the second transistor cells TC2 are otherwise on under reverse bias.

In more detail, a voltage level of the second gate signal VG2 may be higher than Vthp, such as higher than Vthn for low hole injection efficiency in a diode forward conduction phase, lower than the second threshold voltage Vthp and higher than third threshold voltage Vthp2 for low hole injection efficiency in a desaturation phase, and lower than the third threshold voltage Vthp2 for high hole injection efficiency in the surge current mode.

Figure 15:
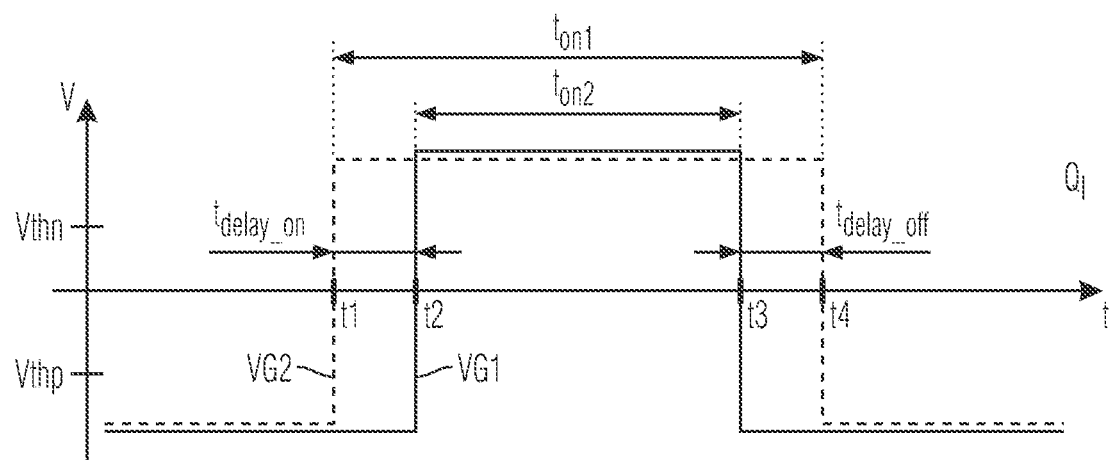
FIG. 15 illustrates a time diagrams of control signals of a semiconductor switching module according to an embodiment related to a light load mode.

FIG. 15 shows the timing of the first and second gate signals VG1, VG2 in a light load mode. The second gate signal VG2 may be controlled such that the voltage level of the second gate signal VG2 may be higher than the first threshold voltage Vthn for an on-time ton2 between t=t1 and t=t4 and lower than the second threshold voltage Vthp outside the on-time ton2 of the second transistor cells TC2 under forward bias. The first gate signal VG1 may be controlled such that the voltage level of the first gate signal VG1 may be higher than the first threshold voltage Vthn for an on-time ton1 between t=t2 and t=t3 and lower than the second threshold voltage Vthp outside the on-time ton1 of the first transistor cells TC1 under forward bias.

Thus the unipolar switching device 20 and the second transistor cells TC2 are turned on before the first transistor cells TC1 are turned on and are turned off after the first transistor cells TC1 are turned off.

The light load mode may be (only, for example) active under forward bias (quadrant I operation mode), or both under forward and reverse bias (quadrant I and III operation modes).

Typically, under light load conditions, a unipolar switching device 20 such as a SiC-MOSFET shows less conduction and turn-off switching losses than an insulated gate bipolar transistor with comparable current ratings. Increasing the load current portion of the unipolar switching device can reduce overall conduction losses.

Figure 16:
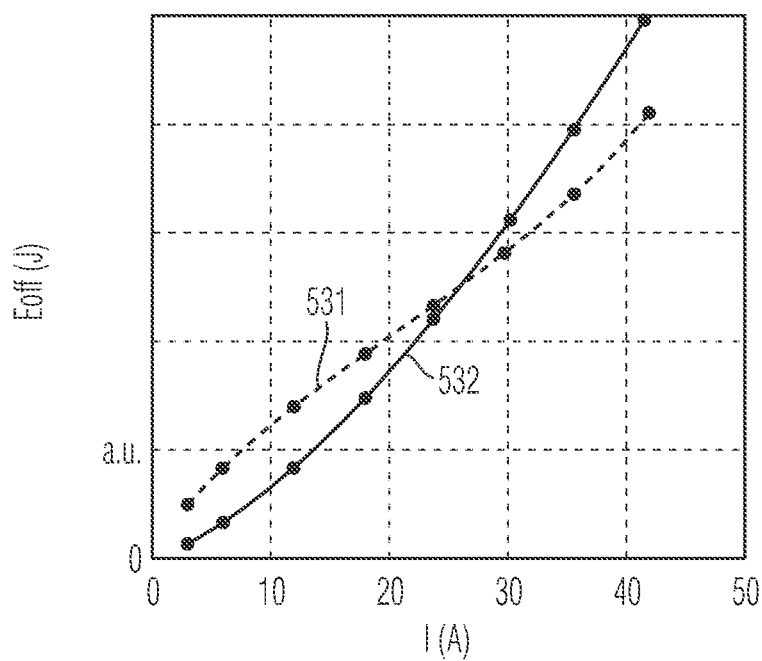
FIG. 16 illustrates a simplified diagram illustrating the dependence of turn-off losses of an IGBT and a SiC-MOSFET on a load current to discuss the effects of a light load mode according to an embodiment.

In FIG. 16, line 531 shows the turn-off switching losses Eoff as a function of a load current I for an IGBT, and line 532 shows the turn-off switching losses Eoff as a function of a load current I of a SiC-MOSFET with approximately the same current rating as the IGBT. For lower load currents up to about 25 A, the SiC-MOSFET shows lower turn-off switching losses Eoff than the IGBT. For higher load currents above about 25 A, the IGBT shows lower turn-off switching losses Eoff than the SiC-MOSFET.

Thus increasing the load current portion of the unipolar switching device for low load currents as it is possible with the light load mode described above can also reduce turn-off switching losses.

FIG. 17 to FIG. 20 show further time diagrams of the first and second gate signals VG1, VG2 for various enhanced modes for improving the IGBT lifetime by using the controllable reverse diode structures RD and the second transistor cells TC2 as described with reference to FIG. 7, FIG. 8 and FIG. 9. The upper time diagram in each of FIG. 17 to FIG. 20 shows the first and second gate signals VG1, VG2 under forward bias (quadrant I operation mode). The lower time diagram in each of FIG. 17 to FIG. 20 shows the first and second gate signals VG1, VG2 under reverse bias (quadrant III operation mode). Though FIG. 17 to FIG. 20 show measurable turn-on delays tdelay_on and measurable turn-off delays tdelay_off, the turn-on delay tdelay_on and/or the turn-off delay tdelay_off may also be 0s in each of the following embodiments, i.e. t1=t2 and/or t3=t4.

Figure 17:
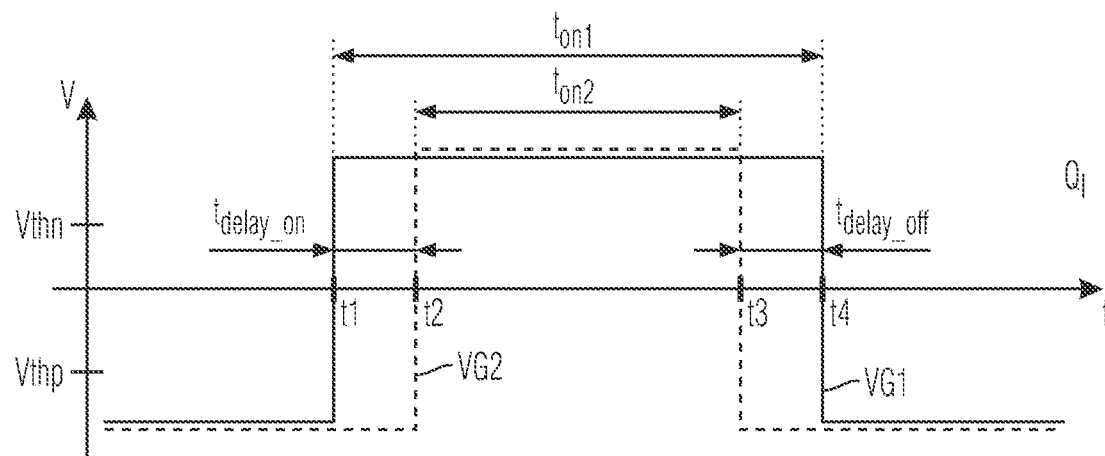
FIG. 17, FIG. 18, FIG. 19, and FIG. 20 illustrate time diagrams of control signals of a semiconductor switching module according to various embodiments related to enhanced modes for improving IGBT lifetime.
Figure 17:
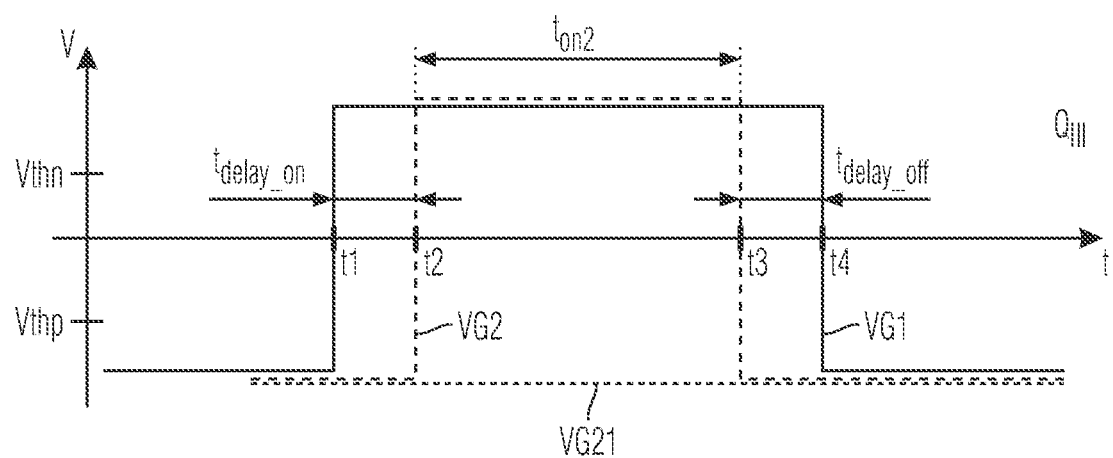

FIG. 17 shows the time diagrams for when the gate driver circuit 400 of FIG. 5 operates in an enhanced mode for improving the IGBT lifetime. When the voltage levels of the first and second gate signals VG1, VG2 exceed the first threshold voltage Vthn, the first and second transistor cells TC1, TC2 turn on and inversion channels form in the diode zones of the reverse diode structures RD. When the voltage levels of the first and second gate signals VG1, VG2 fall below the second threshold voltage Vthp, the first and second transistor cells TC1, TC2 turn off and no inversion channels form in the diode zones of the reverse diode structures RD.

The lower diagram shows the first gate signal VG1 and the second gate signal VG2 under reverse bias (quadrant III operation) in a standard operation method. During the on-time ton2 of the second transistor cells TC2 between t=t2 and t=t3, the positive level of the second gate signal VG2 positively biases the trench electrodes of the reverse diode structures RD. No hole accumulation layer forms in the diode zones of the reverse diode structures RD. The reverse diode of the RC-IGBT may be in a standard diode mode with a higher forward voltage drop than the body diode of the unipolar switching device 20 such that the unipolar switching device 20 carries a great portion of the reverse current. The hybrid semiconductor switch benefits from the low conduction losses of the body diode of the unipolar switching device 20.

In response to an internal or external signal of the gate driver circuit, the enhanced mode for IGBT lifetime improvement becomes active. In the enhanced mode for IGBT lifetime improvement, the gate driver circuit outputs a modified second gate signal VG21 that remains at a voltage level below the second threshold voltage for the total duration of the quadrant III operation mode. Hole inversion layers form along the trench electrode structures in a portion of the drain/collector structure between the diode zones of the reverse diode structures and the bottom of the trench electrode structures. The hole inversion layers invoke an enhanced diode mode for the reverse diode of the RC-IGBT for the total duration of the quadrant III operation mode.

In the enhanced diode mode, the RC-IGBT carries a significant portion of the reverse current, which may be in the order of magnitude of the load current in the on-state of the RC-IGBT. Thus, it is possible to operate the hybrid semiconductor switch such that the RC-IGBT experiences (only, for example) a comparatively small temperature ripple, in particular in combination with an IGBT design ensuring strong thermal coupling between the transistor cells and the reverse diode structure. The low temperature ripple may extend the operational lifetime of the IGBT.

In more detail, the gate driver circuit controls the first gate signal VG1 such that the voltage level of the first gate signal VG1 may be higher than the first threshold voltage Vthn for an on-time ton1 between t=t1 and t=t4 and lower than the second threshold voltage Vthp outside the on-time ton1 of the first transistor cells TC1 both under forward bias (quadrant I operation mode) and under reverse bias (quadrant III operation mode). The gate driver circuit further controls the second gate signal VG2 such that the voltage level of the second gate signal VG2 may be higher than the first threshold voltage Vthn for the on-time ton2 between t=t2 and t=t3 and lower than the second threshold voltage Vthp outside the on-time ton2 of the second transistor cells TC2 under forward bias (quadrant I operation mode).

In the enhanced mode for IGBT lifetime improvement, the gate driver circuit controls the modified second gate signal VG21 such that the voltage level of the modified second gate signal VG21 may be lower than the second threshold voltage Vthp for the complete duration of the quadrant III operation mode.

Figure 18:
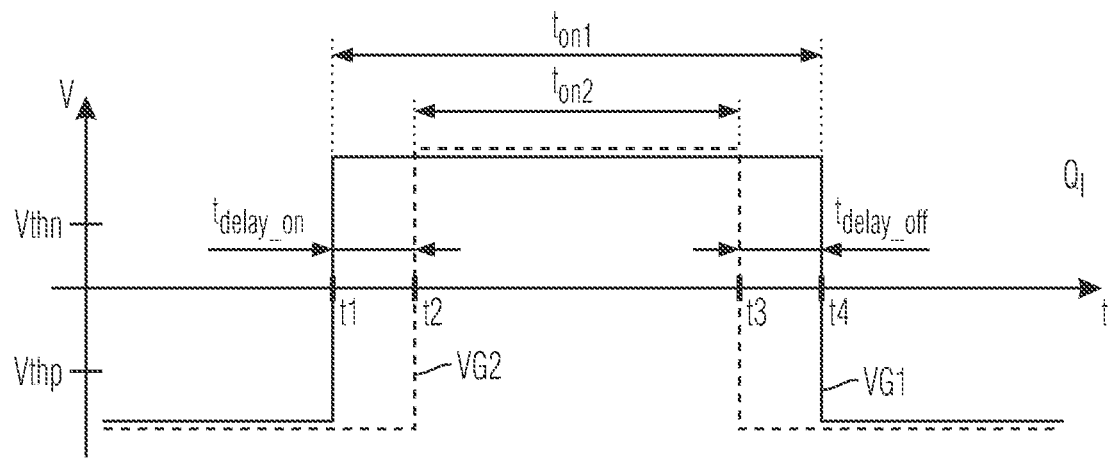
Figure 18:
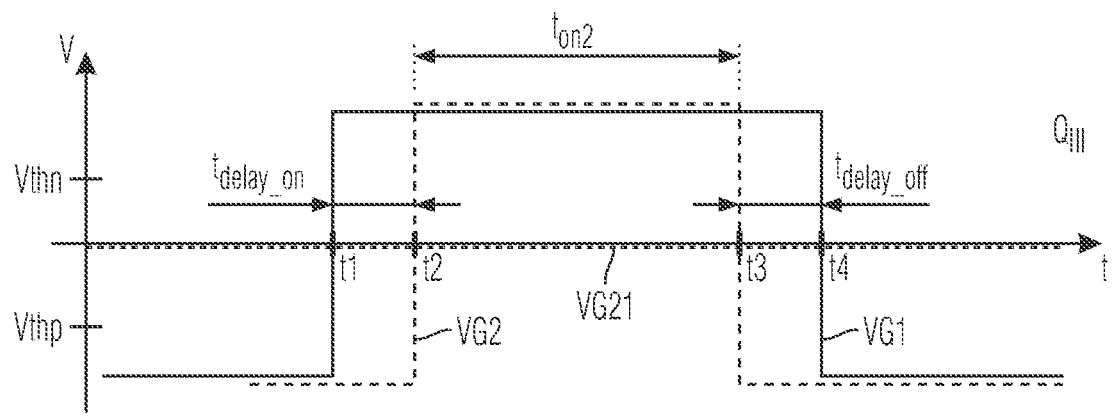

FIG. 18 refers to another enhanced mode for IGBT lifetime improvement. The gate driver circuit controls the second gate signal VG2 such that in the enhanced mode for IGBT lifetime improvement, the voltage level of the second gate signal VG2 may be lower than the first threshold voltage Vthn but higher than the second threshold voltage Vthp for the complete duration of the quadrant III operation mode. No or only weak hole accumulation layers may be formed in the diode zones of the reverse diode structures RD. No or only weak hole inversion layers may form along the trench electrode structures in a portion of the drain/collector structure between the diode zones of the reverse diode structures RD and the bottom of the trench electrode structures.

The current flowing through the RC-IGBT can still be sufficiently high to ensure a sufficiently low temperature ripple. Since the diode enhancement is not fully applied, fewer holes are injected and the charge carrier plasma density in the IGBT may be lower, such that switching losses are lower than in the embodiment of FIG. 17. On the other hand, the forward voltage of the RC diode and thus the conduction losses are higher than in the embodiment of FIG. 17.

Thus the enhanced mode for IGBT lifetime improvement of FIG. 18 may be more suitable for higher switching frequencies, and the enhanced mode for IGBT lifetime improvement of FIG. 17 may be more suitable for lower switching frequencies. The gate driver circuit may allow selecting one of the enhanced modes of FIG. 17 and FIG. 18 in dependence on the switching frequency.

Figure 19:
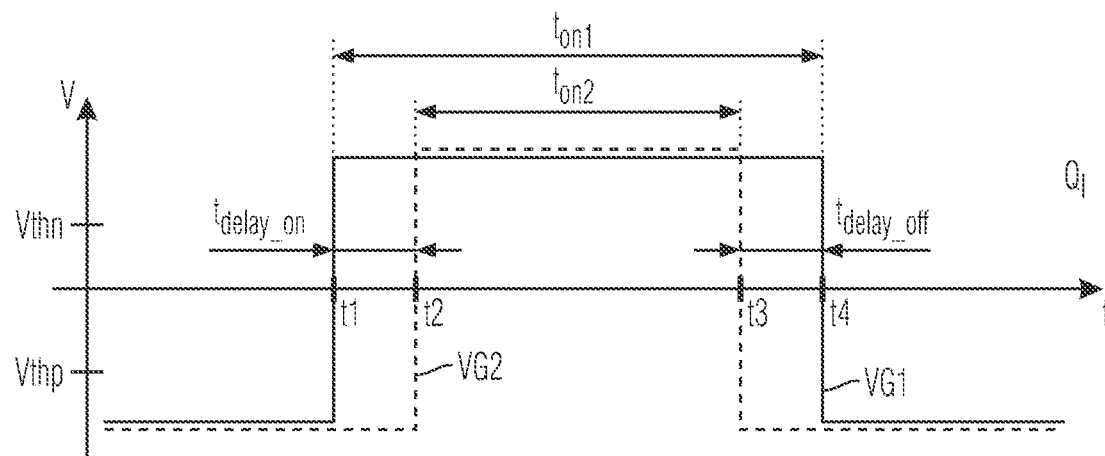
Figure 19:
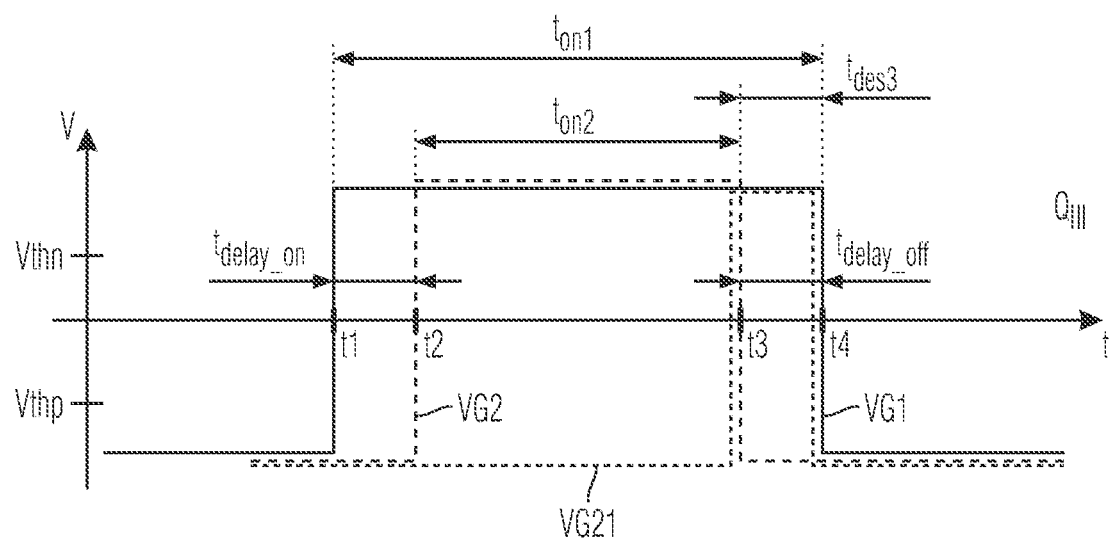

The modified second gate signal VG21 in FIG. 19 differs from the modified second gate signal VG21 in FIG. 17 in a desaturation pulse for a desaturation time tdes3 at the end of the on-time ton1 of the first transistor cells TC1, wherein during the desaturation time tdes3 the voltage level of the modified second gate signal VG21 may be more positive than the second threshold voltage Vthp. For the duration of the desaturation pulse, the hole accumulation layers cease to exist, causing the carrier plasma density to decrease. The embodiment of FIG. 19 benefits from the enhanced diode mode of the reverse diode of the RC-IGBT over a large portion of the reverse conduction period and reduces the switching losses by reducing charge plasma density in a timely manner. The length of the desaturation pulse can be equal to or approximately equal to the length of the turn-off delay tdelay_off.

In the illustrated embodiment, the modified second gate signal VG21 exceeds the first threshold voltage Vthn such that the second transistor cells TC2 may contribute in draining charge carriers, and the desaturation time tdes3 ends not later than t=t4. For example, the on-time ton1 and the desaturation time tdes3 may end synchronously.

According to another embodiment (not shown), the modified second gate signal VG21 does not exceed the first threshold voltage Vthn (e.g., VG21=0V) such that the second transistor cells TC2 remain in the off-state and the desaturation time tdes3 can end even later than t=t4. In case the hybrid semiconductor switch is used as low-side switch or high-side switch of a half-bridge circuit, the desaturation pulse can be extended into the turn-on process of the opposite switch in the half-bridge circuit.

Figure 20:
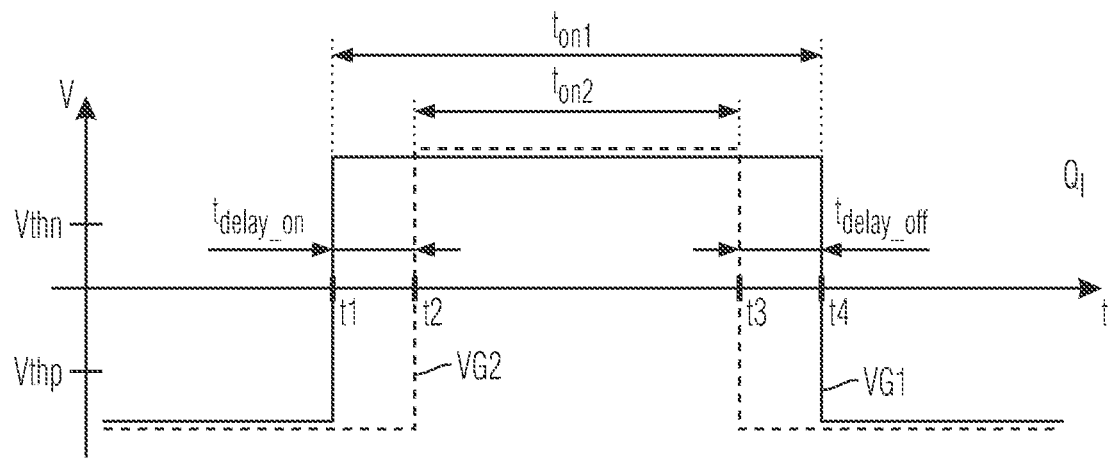
Figure 20:
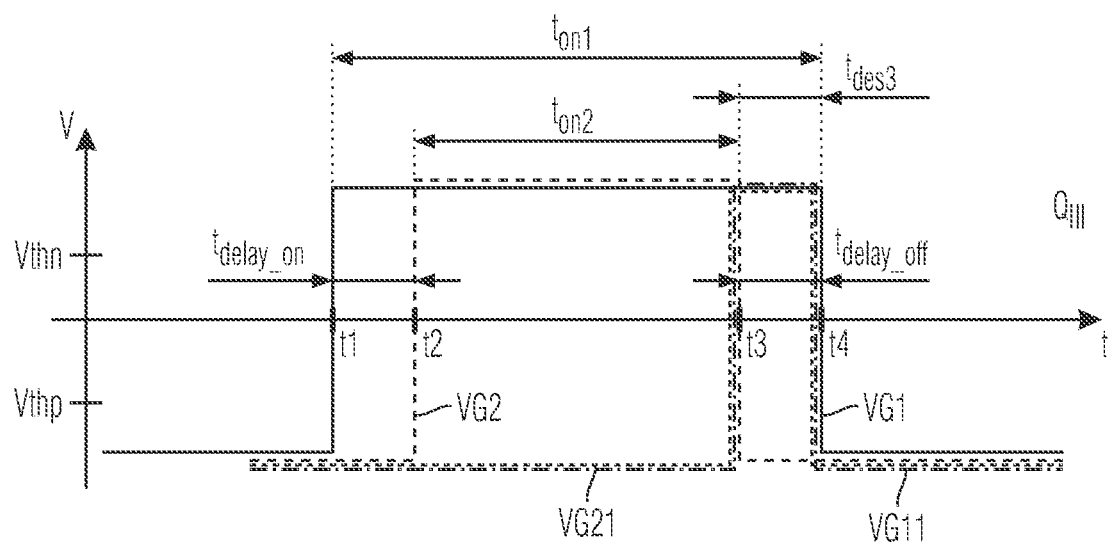

The operation mode illustrated in FIG. 20 differs from the one illustrated in FIG. 19 in a modified first gate signal VG11 for the first transistor cells TC1 under reverse bias (quadrant III operation mode). Rising and falling edges of the modified first gate signal VG11 and the modified second gate signal VG21 may be synchronous. The voltage levels of the modified first gate signal VG11 and the modified second gate signal VG21 are more positive than the second threshold voltage Vthp for the desaturation time tdes3 and fall below the second threshold voltage Vthp outside the desaturation time tdes3. In particular, the voltage levels of the modified first gate signal VG11 and the modified second gate signal VG21 can exceed the first threshold voltage Vthn for the desaturation time tdes3. The voltage levels of the modified first gate signal VG11 and the modified second gate signal VG21 may be equal or approximately equal for the whole operation under reverse bias (quadrant III operation). Compared to the embodiment of FIG. 19, the embodiment benefits from denser charge carrier plasma over a large portion of the reverse operation time and a more efficient desaturation.

The same principle of controlling the first and second gate signals VG1, VG2 synchronously as described with reference to FIG. 20 may be applied to other embodiments, in particular to each of the enhanced modes for IGBT lifetime improvement discussed with reference to FIG. 17, FIG. 18 and FIG. 19.

According to another embodiment (not shown), the semiconductor switching module comprises an IGBT having a structure as illustrated in FIG. 7, FIG. 8 and FIG. 9 and comprises a unipolar switching device. In this embodiment, however, the reverse diode structures RD are connected to the first gate G1. For example, the second trench electrodes 155 corresponding to the reverse diode structures RD are connected to the first gate terminal G1. Thus, in this embodiment, an operation mode of the reverse diode structures RD may be controlled based on the voltage level of the first gate signal VG1. In this embodiment, the operation mode under forward bias (quadrant I operation mode) is as described and shown in FIG. 20. The operation mode under reverse bias (quadrant III operation mode) uses a modified first gate signal VG11 for the first transistor cells TC1 and the reverse diode structures RD, and uses the same second gate signal VG2 as in the forward bias operation mode. That is, in the reverse bias operation mode for this embodiment, the voltage level of the modified first gate signal VG11 may be more positive than the second threshold voltage Vthp for the desaturation time tdes3 and falls below the second threshold voltage Vthp outside the desaturation time tdes3. In particular, the voltage level of the modified first gate signal VG11 can exceed the first threshold voltage Vthn for the desaturation time tdes3. The voltage level of the second gate signal may be more positive than the first threshold voltage Vthn during the on-time ton2 of the second transistor cells TC2, and may be more negative than the second threshold voltage Vthp outside of the on-time ton2 of the second transistor cells TC2. Thus, the reverse diode structures RD remain in the enhanced diode mode for the complete on-time ton2 of the second transistor cells TC in the reverse bias operation mode (quadrant III operation mode), contributing strongly to the reverse conductivity of the semiconductor switching module. In a variation of this embodiment, there can be an overlap of the on-time ton2 of the second transistor cells TC2 and the desaturation time tdes3, such that the voltage level of the second gate signal VG2 may be more positive than the first threshold voltage Vthn and the voltage level of the modified first gate signal VG11 may be more positive than the second threshold voltage Vthp, or more positive than the first threshold voltage Vthn. In a half-bridge configuration, as shown in FIG. 6, the second gate signal can be the same for forward bias operation (quadrant I operation mode) and for reverse bias operation (quadrant III operation mode), while the first gate signal may be selected as described above. Independent of whether the semiconductor switching module is in forward bias operation mode or in reverse bias operation mode, at least one of the first gate signal or the second gate signal may be more positive than the second threshold voltage Vthp, or even more positive than the first threshold voltage Vthn.

Figure 21:
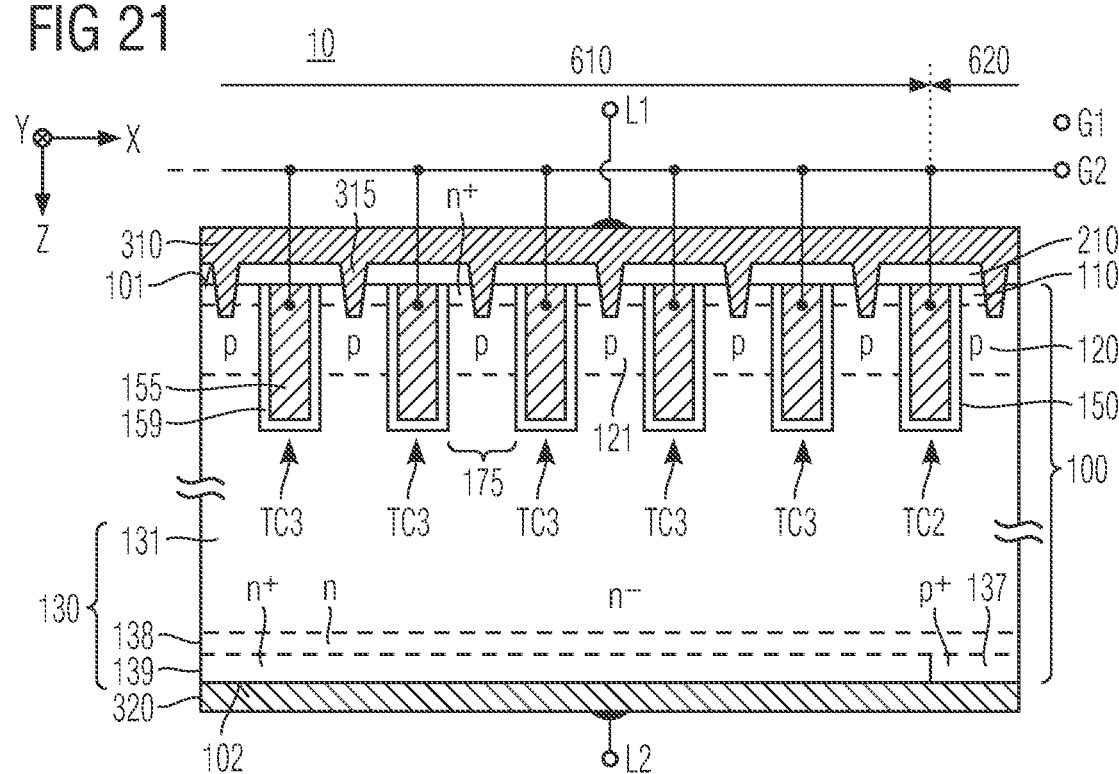
FIG. 21 illustrates a schematic vertical cross-sectional view of a portion of another RC-IGBT with two independently controlled groups of transistor cells usable for a semiconductor switching module according to an embodiment related to an IGBT with third transistor cells.

The IGBT 10 shown in FIG. 21 differs from the IGBT 10 shown in FIG. 8 in that the auxiliary cells are formed as third transistor cells TC3. The trench electrodes 155 of the third transistor cells TC3 are electrically connected to the second gate terminal G2. The third transistor cells TC3 differ from the second transistor cells TC2 in the lateral distance to the closest second zones 137 of the collector layer. The third transistor cells TC3 have a greater lateral distance to the closest second zone 137 of the collector layer than the second transistor cells TC2. Each third transistor cell TC3 contributes less to the overall current than any of the second transistor cells TC2. The third transistor cells TC3 are off (in a transistor-off mode), when a voltage level of the second gate signal VG2 may be lower than the first threshold voltage Vthn. The third transistor cells TC3 are on (in a transistor-on mode), when the voltage level of the second gate signal VG2 exceeds the first threshold voltage Vthn.

Each second transistor cell TC2 includes a source region 110 that may be formed directly above one of the second zones 137. By contrast, none of the source regions 110 of any third transistor cell TC3 laterally overlaps with one of the second zones 137. In other words: Each source region 110 of each third transistor cell TC3 may be not only vertically spaced from any second zone 137 but may also laterally spaced from any second zone 137, such as by at least a mean lateral width of the trench electrode structures 150.

In the illustrated embodiment, the third transistor cells TC3 are formed in the diode region 610 directly above a contiguous first zone 139 and are laterally separated from the transistor region 620.

When combined with desaturation pulses as used in the enhanced modes for improving the IGBT lifetime shown in FIG. 19 and FIG. 20, the third transistor cells TC3 turn on for the desaturation pulse. In particular, the positive potential at the trench electrodes 155 of the third transistor cells TC3 induce inversion channels that directly drain electrons from the drain/collector structure 130 to the source regions 110 and the contact structures 315 and that prevent holes from being injected from the body regions 121 of the third transistor cells TC3 into the drain/collector structure 130. Thus, the third transistor cells TC3 facilitate a high efficient desaturation during the desaturation time tdes3.

Figure 22:
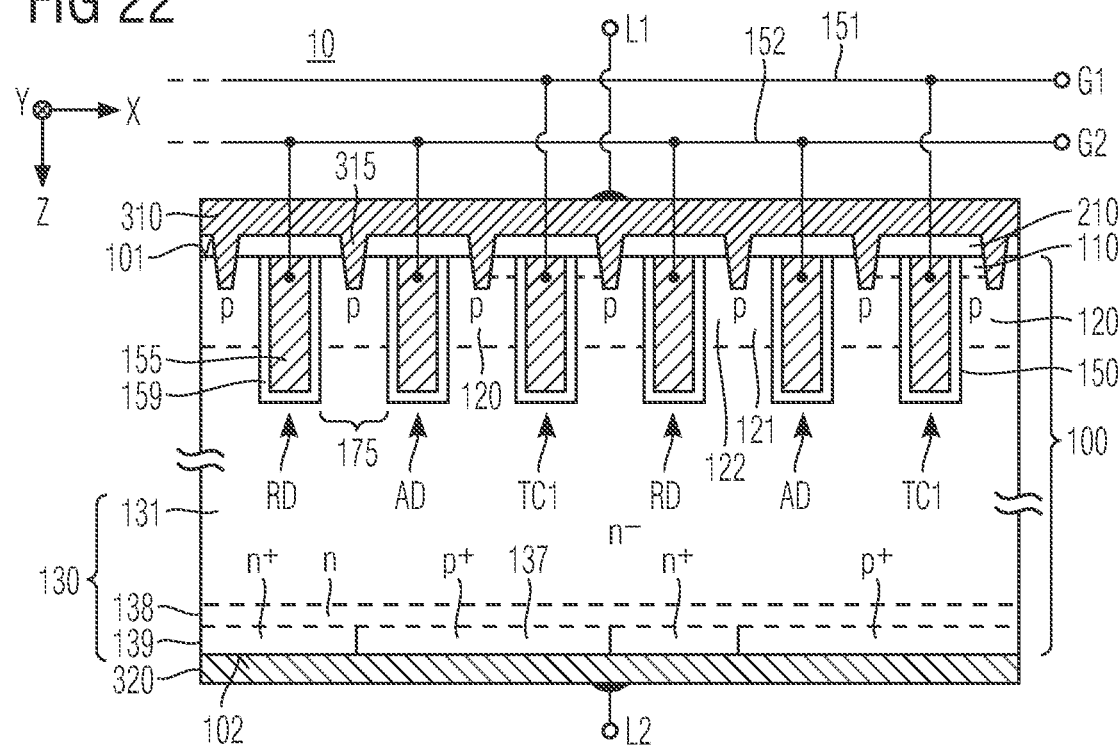
FIG. 22 illustrates a schematic vertical cross-sectional view of a portion of another RC-IGBT with two independently controlled groups of transistor cells usable for a semiconductor switching module according to an embodiment related to an IGBT with auxiliary diode structures as supplemental cells.

The IGBT 10 shown in FIG. 22 differs from the IGBT 10 shown in FIG. 7 in that the supplemental cells are formed as auxiliary diode structures AD. The trench electrodes 155 of the auxiliary diode structures AD are electrically connected to the second gate terminal G2. The auxiliary diode structures AD differ from the reverse diode structures RD in the lateral distance to the closest first zones 139 of the collector layer. The auxiliary diode structures AD have a greater lateral distance to the closest first zone 139 of the collector layer than the reverse diode structure RD. Each auxiliary diode structures AD contributes less to the overall reverse current than any of the reverse diode structure RD.

In particular, the IGBT 10 has no second transistor cells TC2 as described in the previous Figures. In a light load operation mode with the first gate signal VG1 below the first threshold voltage Vthn during a desaturation period tdelay_off (quadrant I operation), a voltage level of the second gate signal VG2 exceeding the first threshold voltage Vthn keeps on (only, for example) the unipolar switching device 20, whereas the IGBT 10 remains (completely, for example) off. The hybrid semiconductor switch benefits to a high degree from the low forward conduction losses and low switching losses in the unipolar switching device 20 under light load conditions.

The invention claimed is:

1. A semiconductor switching module, comprising:
   an insulated gate bipolar transistor comprising:
      a first transistor cell comprising a first gate and a first source; and
      a second transistor cell comprising a second gate and a second source comprising a supplemental electrode; and
   a unipolar switching device based on a wide bandgap material and comprising a third gate and a third source,
   wherein the third gate is electrically connected with the second gate;
   wherein the third gate and the second gate are disconnected from the first gate;
   wherein the first source, the supplemental electrode and the third source are electrically connected with each other;
   wherein the insulated gate bipolar transistor comprises a reverse diode structure electrically connected in parallel to the first transistor cell and the second transistor cell;
   wherein an operation mode of the reverse diode structure is switchable between an enhanced diode mode and a standard diode mode by a second gate signal applied to the second gate; and
   wherein a forward conductivity of the reverse diode structure in the enhanced diode mode is higher than a second forward conductivity of the reverse diode structure in the standard diode mode.

2. The semiconductor switching module according to claim 1, comprising:
   a conduction loss reduction unit configured to:
      turn on the unipolar switching device and the second transistor cell after turning on the first transistor cell.

3. The semiconductor switching module according to claim 2, wherein:
   the conduction loss reduction unit is configured to:
      turn off the unipolar switching device and the second transistor cell prior to turning off the first transistor cell.

4. The semiconductor switching module according to claim 1, comprising:
   a short-circuit protection unit configured to omit turning on the unipolar switching device and the second transistor cell if a short-circuit condition is detected.

5. The semiconductor switching module according to claim 1, comprising:
   an overcurrent protection unit configured to turn off the unipolar switching device and the second transistor cell when an overcurrent condition is detected.

6. The semiconductor switching module according to claim 1, wherein:

the reverse diode structure comprises a trench electrode structure comprising a trench electrode electrically connected with the second gate.

7. The semiconductor switching module according to claim 6, wherein:
a doped diode zone is in contact with a sidewall of the trench electrode structure.

8. The semiconductor switching module according to claim 1, comprising:
a plurality of evenly distributed reverse diode structures.

9. The semiconductor switching module according to claim 1, wherein:
the insulated gate bipolar transistor comprises a diode region and a transistor region;
the reverse diode structure is formed in the diode region; and
the first transistor cell and the second transistor cell are formed in the transistor region.

10. The semiconductor switching module according to claim 1, comprising:
a reverse current control unit configured to switch the reverse diode structure into the enhanced diode mode in response to a level change of a diode control signal.

11. The semiconductor switching module according to claim 10, comprising:
a diode mode control unit configured to activate the diode control signal in response to a second mode control signal.

12. The semiconductor switching module according to claim 10, comprising:
a surge current control unit configured to activate the diode control signal in response to detection of a surge current event.

13. The semiconductor switching module according to claim 1, comprising:
a light load mode unit configured to turn on the unipolar switching device and the second transistor cell when at least one of the first transistor cell is off or a light load condition is met.

14. The semiconductor switching module according to claim 13, wherein:
the light load mode unit is configured to turn on the first transistor cell after the turning on of the unipolar switching device and the second transistor cell.

15. The semiconductor switching module according claim 14, wherein:
the light load mode unit is configured to turn off the unipolar switching device and the second transistor cell after turning off the first transistor cell when the light load condition is met.

16. A semiconductor switching module, comprising:
an insulated gate bipolar transistor comprising:
a first transistor cell comprising a first gate and a first source; and
a second transistor cell comprising a second gate and a second source comprising a supplemental electrode;
a unipolar switching device based on a wide bandgap material and comprising a third gate and a third source; and
a light load mode unit configured to turn on the unipolar switching device and the second transistor cell when at least one of the first transistor cell is off or a light load condition is met,
wherein the third gate is electrically connected with the second gate;
wherein the third gate and the second gate are disconnected from the first gate; and
wherein the first source, the supplemental electrode and the third source are electrically connected with each other.

17. The semiconductor switching module according to claim 16, comprising:
a conduction loss reduction unit configured to:
turn on the unipolar switching device and the second transistor cell after turning on the first transistor cell.

18. The semiconductor switching module according to claim 17, wherein:
the conduction loss reduction unit is configured to:
turn off the unipolar switching device and the second transistor cell prior to turning off the first transistor cell.

19. A semiconductor switching module, comprising:
an insulated gate bipolar transistor comprising:
a first transistor cell comprising a first gate and a first source; and
a second transistor cell comprising a second gate and a second source comprising a supplemental electrode;
a plurality reverse diode structures; and
a unipolar switching device based on a wide bandgap material and comprising a third gate and a third source,
wherein the third gate is electrically connected with the second gate;
wherein the third pate and the second pate are disconnected from the first pate;
wherein the first source, the supplemental electrode and the third source are electrically connected with each other; and
at least one of:
wherein the semiconductor switching module comprises a light load mode unit configured to turn on the unipolar switching device and the second transistor cell when at least one of the first transistor cell is off or a light load condition is met; or
wherein:
the insulated gate bipolar transistor comprises a reverse diode structure electrically connected in parallel to the first transistor cell and the second transistor cell;
an operation mode of the reverse diode structure is switchable between an enhanced diode mode and a standard diode mode by a second gate signal applied to the second gate; and
a forward conductivity of the reverse diode structure in the enhanced diode mode is higher than a second forward conductivity of the reverse diode structure in the standard diode mode.

20. The semiconductor switching module according to claim 19, comprising:
a conduction loss reduction unit configured to:
turn on the unipolar switching device and the second transistor cell after turning on the first transistor cell; and
turn off the unipolar switching device and the second transistor cell prior to turning off the first transistor cell.

* * * * *